(12) United States Patent
Gibson et al.

(10) Patent No.: US 10,651,333 B2
(45) Date of Patent: *May 12, 2020

(54) TILED SOLAR CELL LASER PROCESS

(71) Applicant: SOLARIA CORPORATION, Fremont, CA (US)

(72) Inventors: Kevin R. Gibson, Redwood City, CA (US); Aureo Parilla, Hayward, CA (US); Thomas Phu, Fremont, CA (US)

(73) Assignee: SOLARIA CORPORATION, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/691,408

(22) Filed: Nov. 21, 2019

(65) Prior Publication Data

US 2020/0091369 A1 Mar. 19, 2020

Related U.S. Application Data

(63) Continuation of application No. 16/418,859, filed on May 21, 2019, now Pat. No. 10,522,707, which is a continuation of application No. 15/622,000, filed on Jun. 13, 2017, now Pat. No. 10,347,788, which is a (Continued)

(51) Int. Cl.
*H01L 21/00* (2006.01)
*H01L 31/18* (2006.01)
*H01L 31/044* (2014.01)

(52) U.S. Cl.
CPC ........ *H01L 31/1876* (2013.01); *H01L 31/044* (2014.12); *Y02E 10/50* (2013.01)

(58) Field of Classification Search
CPC .... H01L 31/044; H01L 31/1876; Y02E 10/50
See application file for complete search history.

(56) References Cited

U.S. PATENT DOCUMENTS 10,347,788 B2 * 7/2019 Gibson ............... H01L 31/1876
10,522,707 B2 * 12/2019 Gibson ............... H01L 31/1876
(Continued)

FOREIGN PATENT DOCUMENTS

| EP | 2284908 A1 | 2/2011 |
| KR | 10-2011-0031071 A | 3/2011 |
| KR | 10-2013-0027900 A | 3/2013 |

OTHER PUBLICATIONS

International Search Report and Written Opinion for International Patent Application No. PCT/US2016/015800 dated May 12, 2016.

*Primary Examiner* — Richard A Booth

(57) ABSTRACT

In an example, the present invention provides a method of separating a photovoltaic strip from a solar cell. The method includes providing a solar cell, placing the front side of the solar cell on a platen such that the backside is facing a laser source, initiating a laser source to output a laser beam having a wavelength from 200 to 600 nanometers and a spot size of 18 to 30 microns, subjecting a portion of the backside to the laser beam at a power level ranging from about 20 Watts to about 35 Watts to cause an ablation to form a scribe region having a depth, width, and a length, the depth being from 40% to 60% of a thickness of the solar cell, the width being between 16 and 35 microns to create a plurality of scribe regions spatially disposed on the backside of the solar cell.

20 Claims, 29 Drawing Sheets

Related U.S. Application Data continuation-in-part of application No. 14/609,307, filed on Jan. 29, 2015.

(60) Provisional application No. 62/349,547, filed on Jun. 13, 2016.

(56) References Cited

U.S. PATENT DOCUMENTS

2011/0079263 A1    4/2011   Avrutsky
2012/0180843 A1    7/2012   Park

* cited by examiner

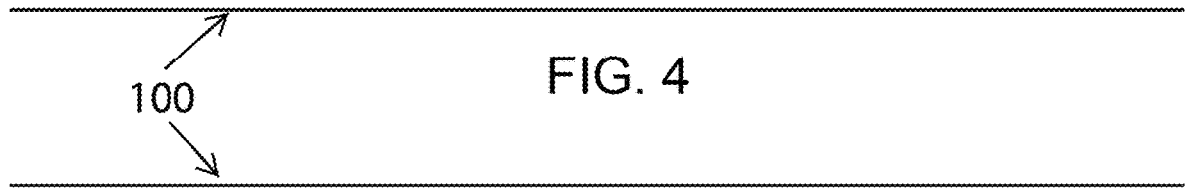
FIG. 4
FIG. 5
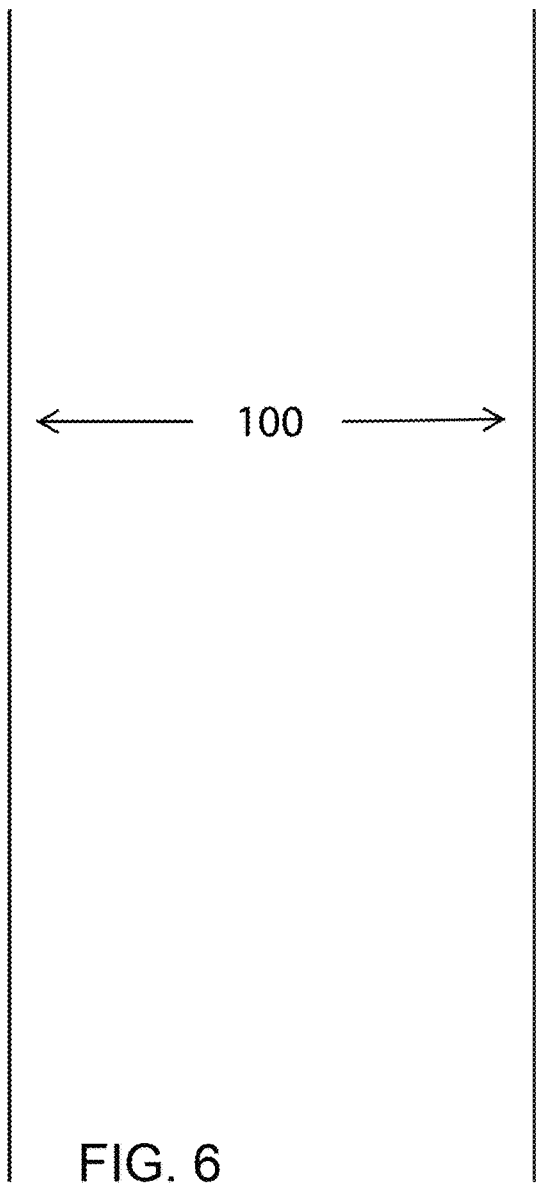
FIG. 6　　FIG. 7

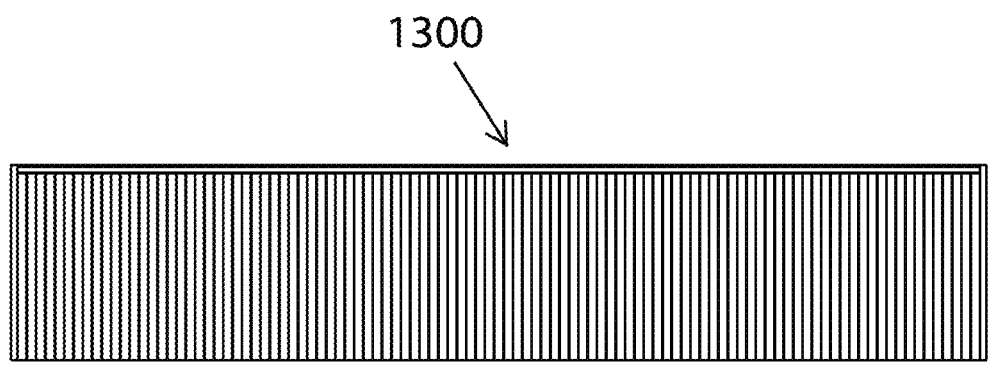
FIG. 15
FIG. 16
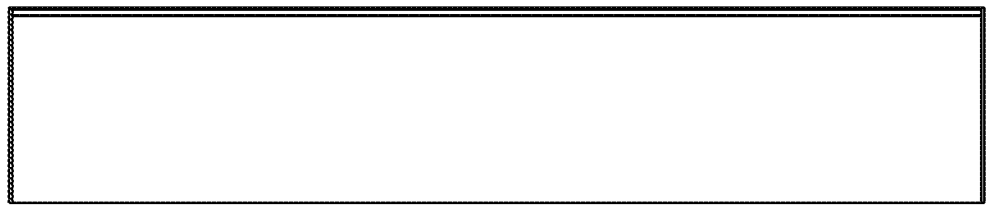
FIG. 17

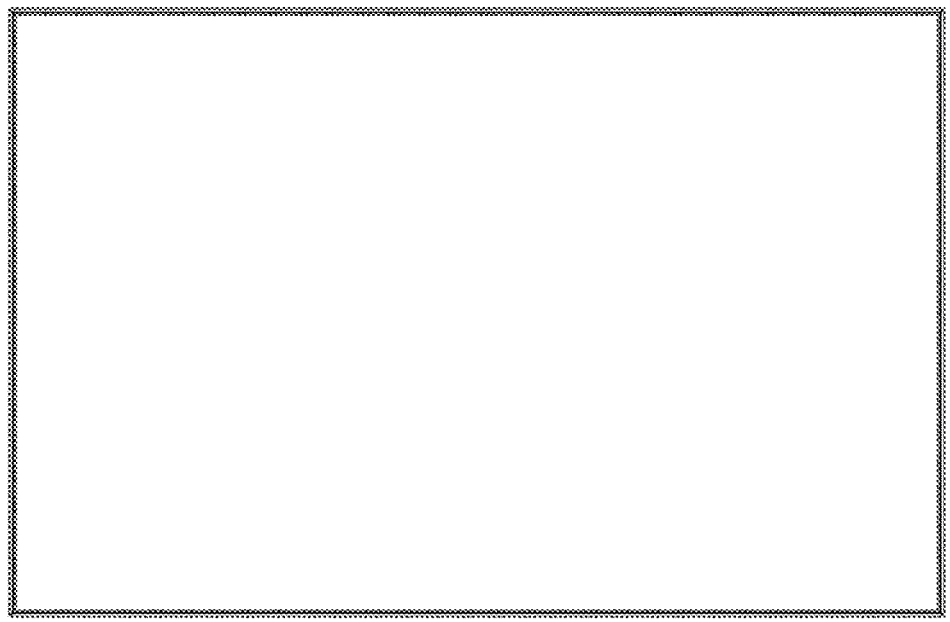
FIG. 21
2100 →
FIG. 22
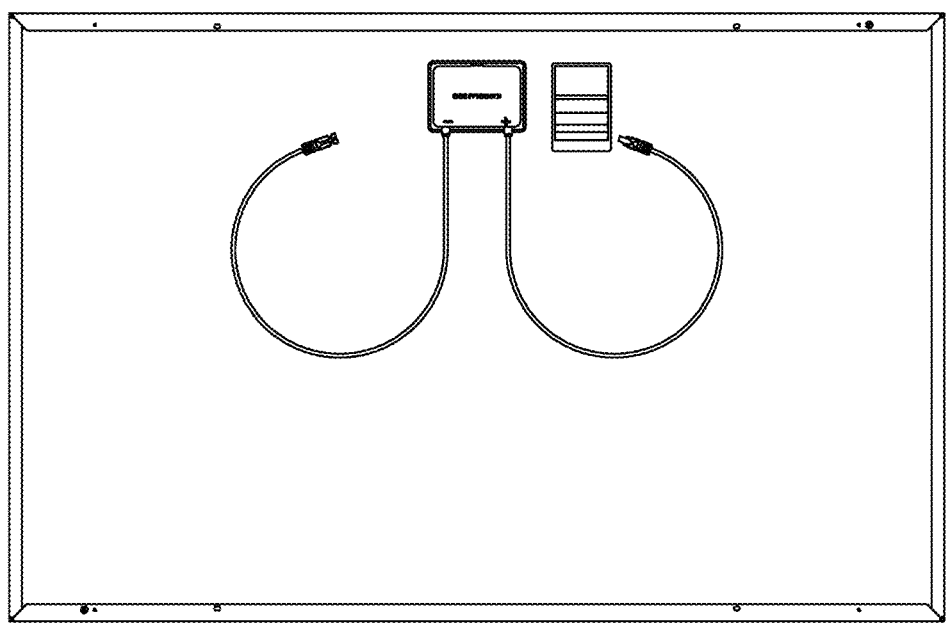
FIG. 23

TILED SOLAR CELL LASER PROCESS

This application is a continuation of U.S. application Ser. No. 16/418,859 filed May 21, 2019, which is a continuation of U.S. application Ser. No. 15/622,000, filed Jun. 13, 2017, now issued as U.S. Pat. No. 10,347,788 on Jul. 9, 2019, which is a non-provisional of U.S. Provisional Application No. 62/349,547, filed Jun. 13, 2016, and this application also claims priority to U.S. patent application Ser. No. 14/609,307, filed Jan. 29, 2015, which is incorporated by reference herein for all purposes.

BACKGROUND OF THE INVENTION

The present invention is directed to photovoltaic systems and manufacturing processes and apparatuses thereof.

As the population of the world has increased, industrial expansion has led to a corresponding increased consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

In addition to oil, we have also relied upon other very useful sources of energy such as hydroelectric, nuclear, and the like to provide our electricity needs. As an example, most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally, plant life on the Earth achieves life using photosynthesis processes from sunlight. Fossil fuels such as oil were also developed from biological materials derived from energy associated with the sun. For life on the planet Earth, the sun has been our most important energy source and fuel for modern day solar energy.

Solar energy possesses many desirable characteristics; it is renewable, clean, abundant, and often widespread. Certain technologies developed often capture solar energy, concentrate it, store it, and convert it into other useful forms of energy.

Solar panels have been developed to convert sunlight into energy. For example, solar thermal panels are used to convert electromagnetic radiation from the sun into thermal energy for heating homes, running certain industrial processes, or driving high-grade turbines to generate electricity. As another example, solar photovoltaic panels are used to convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successfully for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, the panels are often composed of costly photovoltaic silicon bearing wafer materials, which are often difficult to manufacture efficiently on a large scale, and sources can be limited.

Solar cells are manufactured in a set of predetermined sizes. For example, cells are typically produced to have a width and length of approximately 156 mm. Current, voltage and resistance for such cells are largely related to the material and size characteristics of the cells. For example, cell current is directly proportional to cell area. Therefore, standard size solar cells tend to have very similar characteristics, which limits the ability of manufacturers to optimize characteristics of modules that employ a plurality of cells. Accordingly, some manufacturers cut standard sized cells into smaller parts, which may be referred to as strips, to affect the characteristics of the photovoltaic materials.

Conventionally, solar cells are mechanically cut with a saw. However, this technique has numerous disadvantages. The saw blades are very expensive, and must be replaced regularly. Saw blades wear quickly, so the quality of cuts progressively degrades after the first cut. Saw cutting processes generate a substantial amount of heat at the cutting surface, which can damage a cell. The combination of particulate and force from the cutter can cause particulate to be embedded in the cells, leading to degraded performance. In addition, water flushing to remove heat and particulate in a mechanical cutting process can damage cells.

Therefore, it is desirable to have novel system and method for manufacturing solar panels.

BRIEF SUMMARY OF THE INVENTION

The present invention is directed to photovoltaic systems and manufacturing processes and apparatuses thereof.

In an example, a method includes providing a solar cell comprising either a single crystalline silicon material or a polycrystalline solar cell, the solar cell having a backside and a front side and a thickness, the backside having a metal material, placing the front side of the solar cell on a platen such that the backside is facing a laser source, initiating a laser source to output a laser beam having a wavelength from 200 to 600 nanometers and a spot size of 18 to 30 microns, subjecting a portion of the backside to the laser beam at a power level ranging from about 20 Watts to about 35 Watts to cause an ablation to form a scribe region having a depth, width, and a length, the depth being from 40% to 60% of a thickness of the solar cell, the width being between 16 and 35 microns, and the length being equivalent to a length of the solar cell, and repeating the step of subjecting to create a plurality of scribe regions spatially disposed on the backside of the solar cell.

In an embodiment, the method includes moving the laser beam at a rate of 4800 to 5000 mm per second. The method may include subjecting the cell to the laser at least twice along the scribe region. In an example, the cell is subjected to the laser in 10 to 25 passes.

In an example, the scribe region is shaped as a notch as viewed along an end of the scribe region.

In an example, the method further includes detecting a thickness of the solar cell and setting at least one of speed of a movement of the laser beam or number of passes based upon the thickness of the thickness of the solar cell.

In an example, the detecting includes applying a red laser to a surface solar cell to identify a height of the thickness of material.

In an example, the method includes adjusting a number of passes for the scribe region to accommodate a thickness variation of the thickness of the solar cell.

In an example, the detecting occurs using a laser having a different color than the laser beam from the laser source. The separating may occur within a time frame of 1 second to about 6 seconds to provide the plurality of scribe regions.

In an example, the laser beam has a wavelength in the green spectrum.

In an example, the method includes delivering a jet of fluid within a vicinity of the ablation to carry away particulate material, and capturing the particulate material using a vacuum.

In an example, the method includes subjecting a fluid, using a laminar flow, within a vicinity of the ablation to carry away particulate material, and capturing the particulate material using a vacuum.

In an example, the method includes maintaining the cell in a substantially flat position using a vacuum chuck. In an example, the scribe region is a straight line+/−10 microns.

In an example, the method includes scribing a unique identifier on each of the strips. In an example, the solar cell is from 170 to 220 microns thick.

In an example, the laser beam is directed at a backside surface of the solar cell that includes a thickness of aluminum.

In an example, the method includes singulating a strip from the solar cell by applying mechanical stress to a region of the solar cell adjacent to scribe region.

In an example, the scribe region is located, at least in part, between two adjacent bus bars of the solar cell.

In an example, the method includes providing a solar cell comprising either a single crystalline silicon material or a polycrystalline solar material, the solar cell having a backside and a front side and a thickness, the backside having a metal material, and placing the front side of the solar cell on a platen such that the backside is facing a laser source. The method includes initiating a laser source to output a laser beam having a 532 nm wavelength and a spot size of 18 to 30 microns and subjecting a portion of the backside to the laser beam in a reduced power level ranging from about 20 Watts to about 35 Watts to cause an ablation to form a scribe region having a depth, width, and a length, the depth being about ½ of the thickness of the solar cell, the width being about ¼ of the depth, and the length being equivalent to a length of the solar cell. The method includes detecting a thickness of the solar cell and adjusting a speed of a movement of the laser beam based upon a thickness variation of the thickness of the solar cell. The method includes repeating the step of subjecting to create a plurality of scribe regions spatially disposed on the backside of the solar module.

In an example, the method includes moving the laser beam at a rate of 4800 to 5000 mm per second. In an example, the method includes subjecting at least twice along the scribe region. In an example, the scribe region is shaped as a notch as viewed along an end of the scribe region. In an example, the detecting comprises applying a red laser to a surface solar cell to identify a height of the thickness of material. In an example, the adjusting comprises adjusting a number of passes for the scribe region to accommodate a thickness variation of the thickness of the solar cell. In an example, the detecting occurs using a laser having a different color than the laser beam from the laser source. In an example, the method of separating occurs within a time frame of 1 second to about 6 seconds to provide the plurality of scribe regions. In an example, the method further includes maintaining vacuum near a vicinity of the solar cell during the subjecting. In an example, the method includes subjecting a jet of fluid within a vicinity of the ablation to carry away particulate material, and capturing the particulate material using a vacuum. In an example, the method includes subjecting a fluid, using a laminar flow, within a vicinity of the ablation to carry away particulate material, and capturing the particulate material using a vacuum. In an example, the method includes retaining the solar cell on a vacuum chuck to maintain the cell in a substantially flat position. In an example, the scribe region is a straight line+/−10 microns. In an example, the method includes scribing a unique identifier on each of the strips.

In an example, a solar module apparatus is provided. The apparatus has a plurality of strings, each of the plurality of strings being configured in a parallel electrical arrangement with each other and a plurality of photovoltaic strips forming each of the plurality of photovoltaic strings. The apparatus has a first end termination configured along a first end of each of the plurality of strings and a second end termination configured along a second end of each of the plurality of strings. The module has an equivalent diode device configured between the first end termination and the second end termination such that one of the plurality of photovoltaic strips associated with one of the plurality of strings when shaded causes the plurality of strips ("Shaded Strips") associated with the one of the strings to cease generating electrical current from application of electromagnetic radiation, while a remaining plurality of strips, associated with the remaining plurality of strings, each of which generates a current that is substantially equivalent as an electrical current while the Shaded Strips are not shaded, and the equivalent diode device between the first terminal and the second terminal for the plurality of strips is configured to turn-on to by-pass electrical current through the equivalent diode device such that the electrical current that was by-passed traverses the equivalent diode device coupled to the plurality of strips that are configured parallel to each other.

Many benefits can be achieved by ways of the present invention. As an example, the present module can be made using conventional process and materials. Additionally, the present module is more efficient than conventional module designs. Furthermore, the present module, and related techniques provides for a more efficient module usage using by-pass diodes configured with multiple zones of solar cells. Depending upon the example, there are other benefits as well.

A further understanding of the nature and advantages of the present invention may be realized by reference to the remaining portions of the specification and the drawings.

BRIEF DESCRIPTION OF THE DRAWINGS

FIG. 4 is a top view thereof;

FIG. 5 is a bottom view thereof;

FIG. 6 is a first side view thereof;

FIG. 7 is a second side view thereof;

FIGS. 13-17 are illustrations of a center photovoltaic strip according to an example of the present invention;

FIGS. 21-25 illustrate a solar module according to an example of the present invention;

DETAILED DESCRIPTION OF THE INVENTION

The present invention is directed to photovoltaic systems and manufacturing processes and apparatus thereof. There are other embodiments as well.

Embodiments of the present invention provide system and methods for manufacturing high density solar panels. Embodiments of the present invention use overlapped or tiled photovoltaic strip elements to increase the amount of photovoltaic material, thereby increasing an amount of power, while reducing an amount of series resistance losses in the solar panel. It is noted that specific embodiments are shown for illustrative purposes, and represent examples. One skilled in the art would recognize other variations, modifications, and alternatives.

Although orientation is not a part of the invention, it is convenient to recognize that a solar module has a side that faces the sun when the module is in use, and an opposite side that faces away from the sun. Although, the module can exist in any orientation, it is convenient to refer to an orientation where "upper" or "top" refer to the sun-facing side and "lower" or "bottom" refer to the opposite side. Thus an element that is said to overlie another element will be closer to the "upper" side than the element it overlies.

While the above is a complete description of specific embodiments of the invention, the above description should not be taken as limiting the scope of the invention as defined by the claims.

The present disclosure describes a process, system and product for solar cells cut using a laser scribing process. A laser scribing process has numerous advantages over a conventional mechanical sawing process. Laser components have extended life cycles, so maintenance and replacement costs are very low compared to mechanical sawing, which requires regular replacement of high precision saw blades. A laser scribing process is cleaner since mechanical sawing requires a substantial volume of liquid to flush the cutting area. Damage to cells is reduced by a laser process, increasing throughput and reducing costs.

Figure 1:
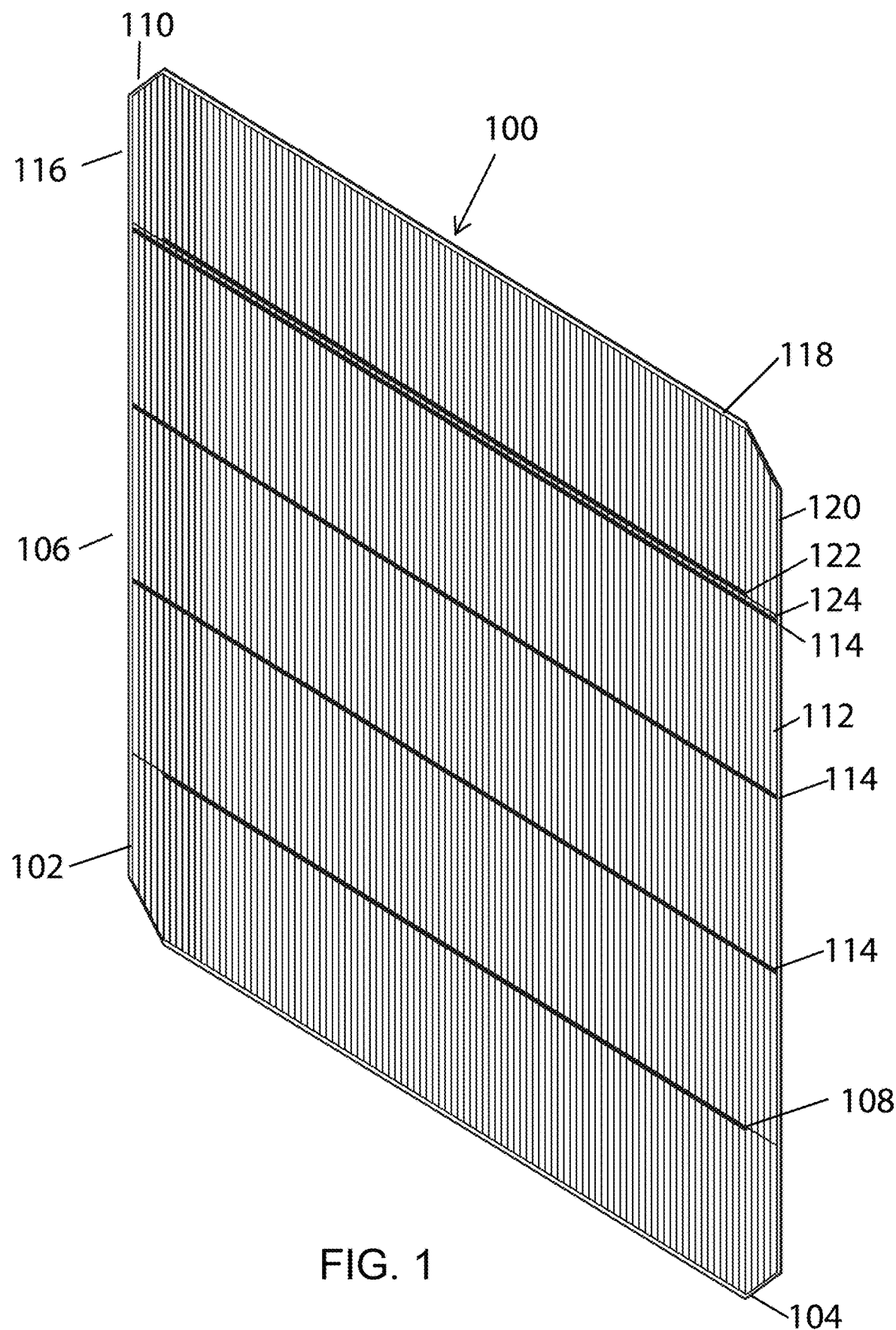
FIG. 1 is a front perspective view of a solar cell article according to an example of the present.

FIG. 1 is a front perspective view of a solar cell article according to an example of the present disclosure. This diagram is merely an example, and should not unduly limit the scope of the claims herein. One of ordinary skill in the art would recognize other variations, modifications, and alternatives. A solar cell 100 is shown. The solar cell 100 has a substrate member having a surface region. The surface region is an aperture region exposing photovoltaic material. In an example, the photovoltaic material can be silicon, polycrystalline silicon, single crystalline silicon, or other photovoltaic materials.

In an example, the cell 100 has the surface region comprising a spatial region and a backside region. The cell has a first end strip 102 comprising a first edge region 104 and a first interior region 106 as provided on the spatial region. In an example, the first interior region 106 comprises a first bus bar 108, while the first edge region on the spatial region has no bus bar. In an example, the first end strip has an off cut 110 on each corner. Each of the off cuts 110 is about 45 degrees in angle, and has a flat edge abutting a pair of edges at ninety degrees from each other, as shown.

After the first bus bar 108, the solar cell has a plurality of strips provided on the spatial region. As shown, each of the strips 112 has a bus bar 114 along an edge furthest away from the first bus bar 108. Each of the strips 112 is substantially rectangular in shape, and can be configured with edges at ninety degrees from each other.

In an example, the cell 100 has a second end strip 116 comprising a second edge region 118 and a second interior region 120. In an example, the second interior region 120 comprises a second bus bar 122 such that the second bus bar and the bus bar 114 from one of the plurality of strips forms a gap defining a scribe region 124. In an example, the second edge region 118 comprises no bus bar.

In an example, the first end strip 102, the plurality of strips 112, and the second end strip 116 are arranged in parallel to each other and occupy the spatial region such that the first end strip, the second end strip, and the plurality of strips consists of a total number of five (5) strips.

Figure 2:
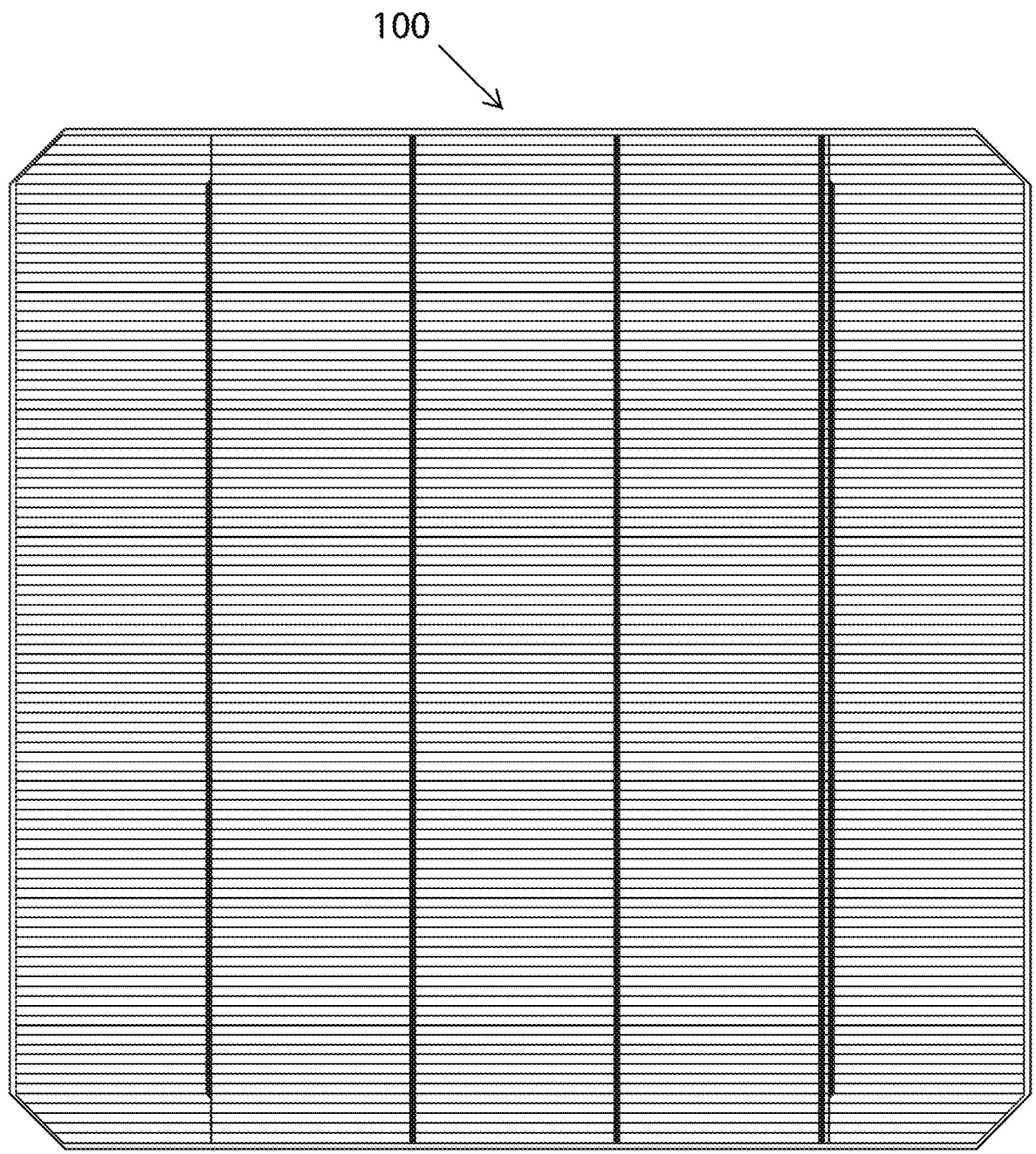
FIG. 2 is a front view thereof.
Figure 3:
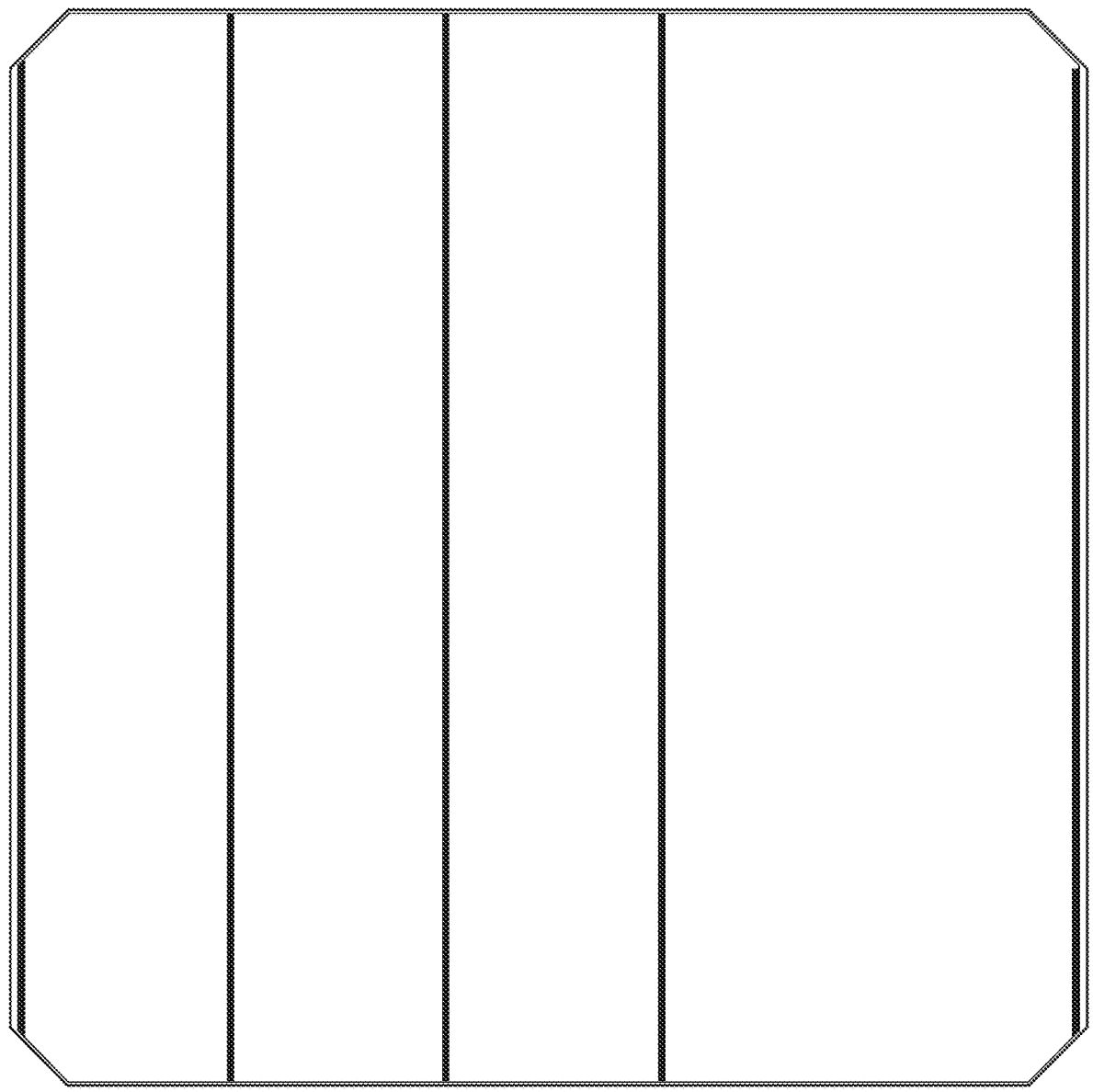
FIG. 3 is a back view thereof.
Figure 8:
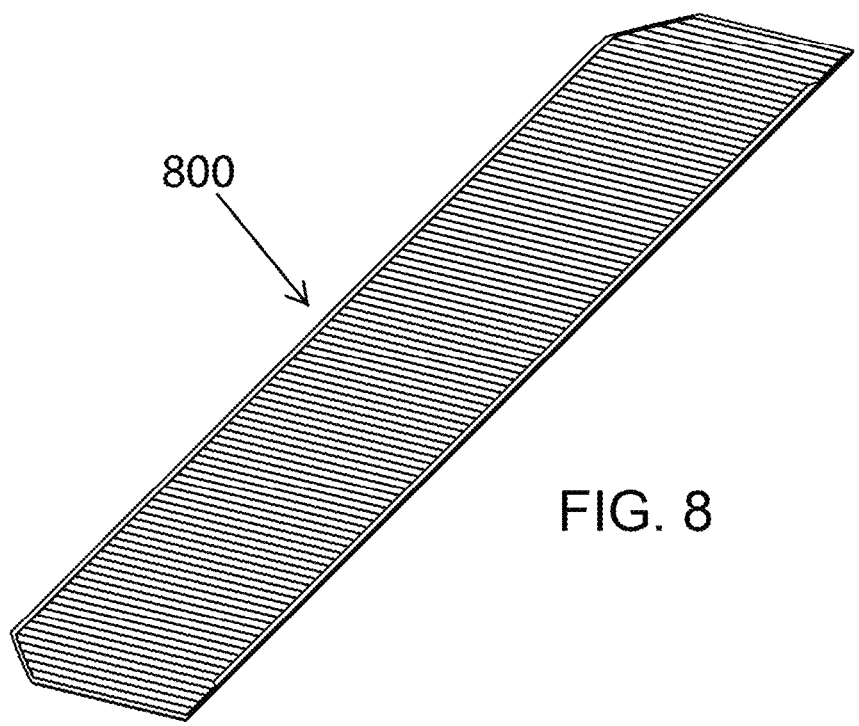
FIGS. 8-12 are illustrations of an edge photovoltaic strip according to an example of the present invention.
Figure 9:
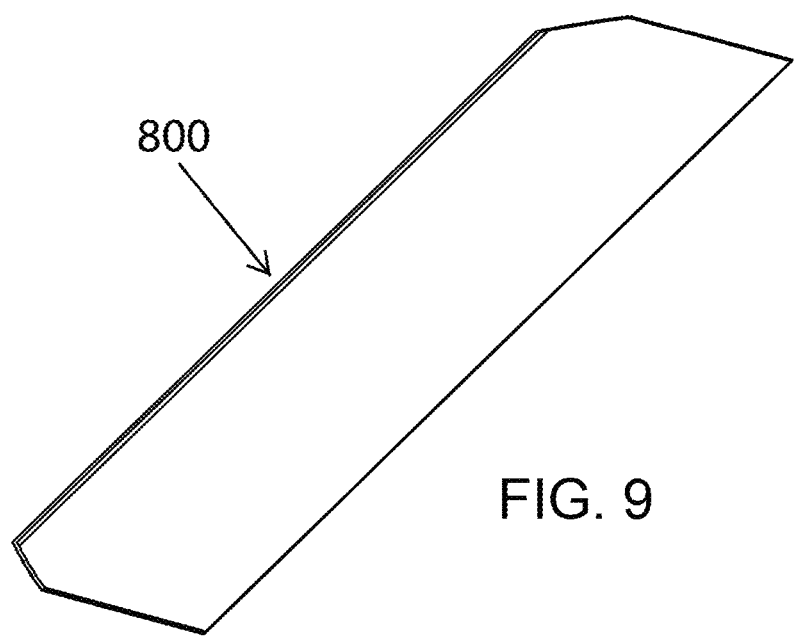
Figure 10:
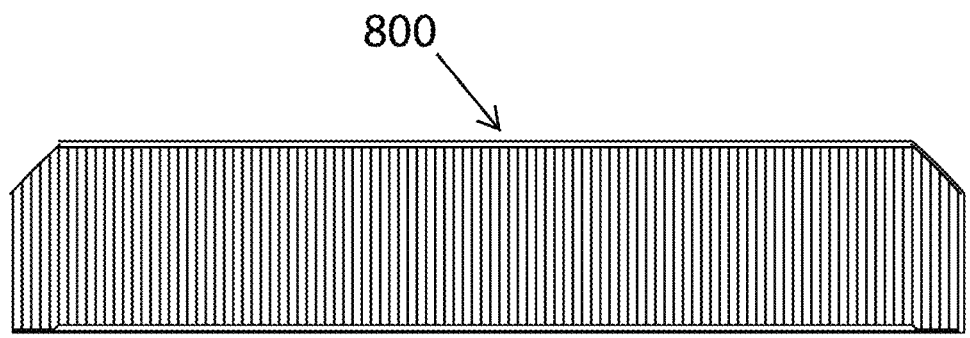
Figure 11:
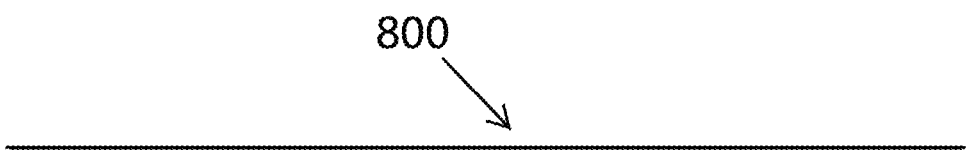
Figure 12:
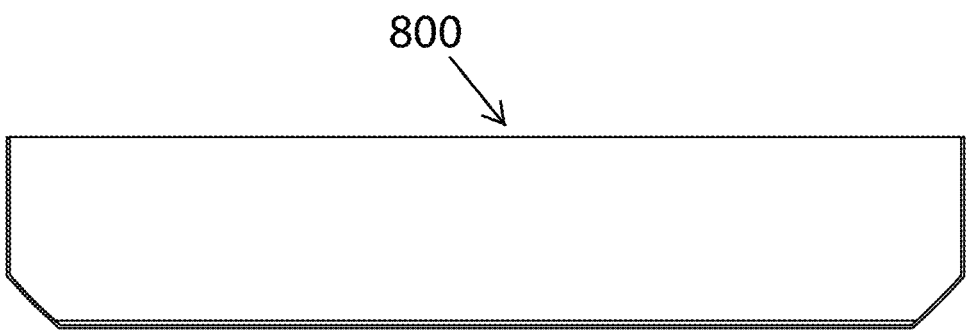
Figure 13:
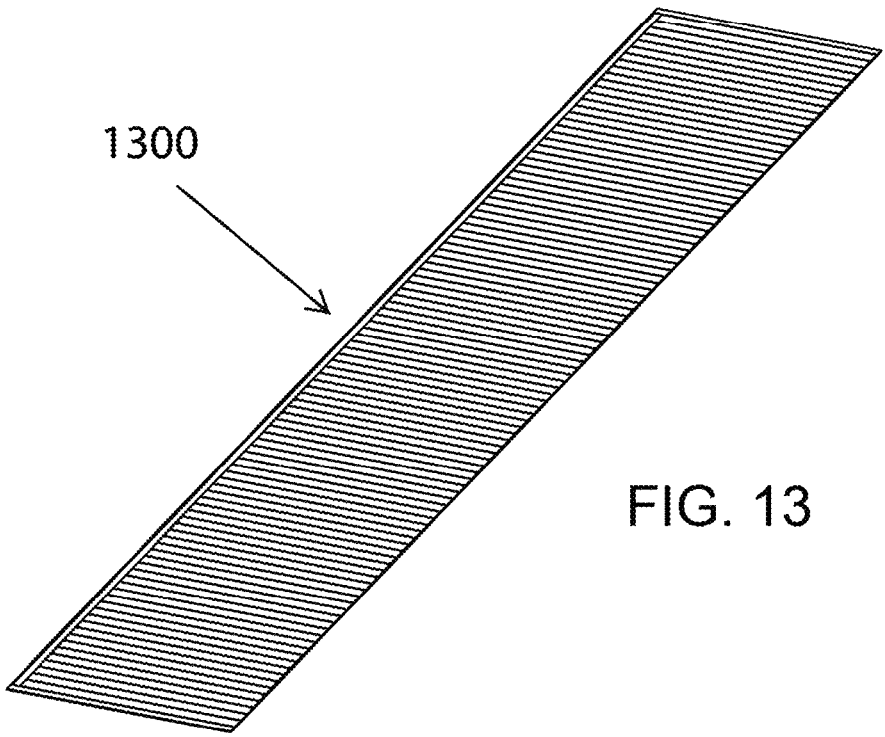
Figure 14:
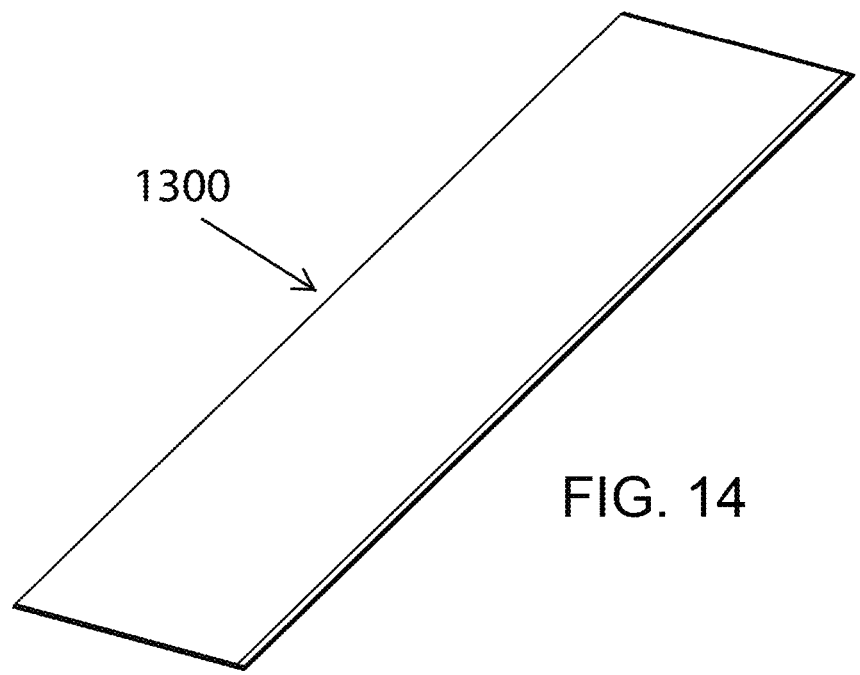

In an example, the backside region 126 comprises the second end strip 116 comprising the second edge region 118. In an example, the second edge region 118 has a second backside bus bar 126 such that the second backside bus bar 126 and the second bus bar 122 are provided between photovoltaic material of the second end strip. FIG. 2 is a front view thereof. FIG. 3 is a back view thereof. FIG. 4 is a top view thereof. FIG. 5 is a bottom view thereof. FIG. 6 is a first side view thereof. FIG. 7 is a second side view thereof.

FIGS. 8-12 are illustrations of an edge photovoltaic strip 800 according to an example of the present invention.

FIGS. 13-17 are illustrations of a center photovoltaic strip 1300 according to an example of the present invention.

Figure 18:
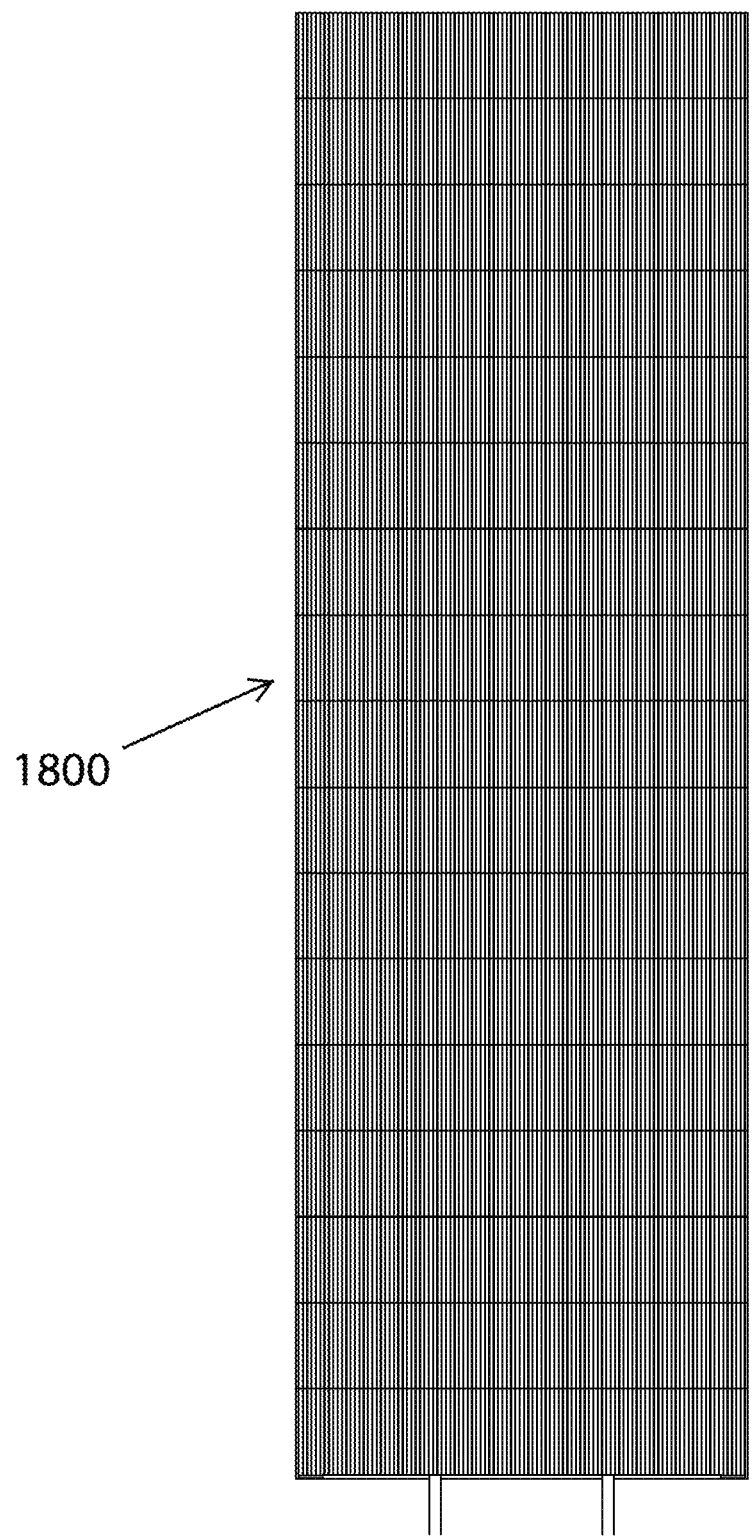
FIGS. 18-20 illustrate a photovoltaic string according to an example of the present invention.
Figures 19, 20:
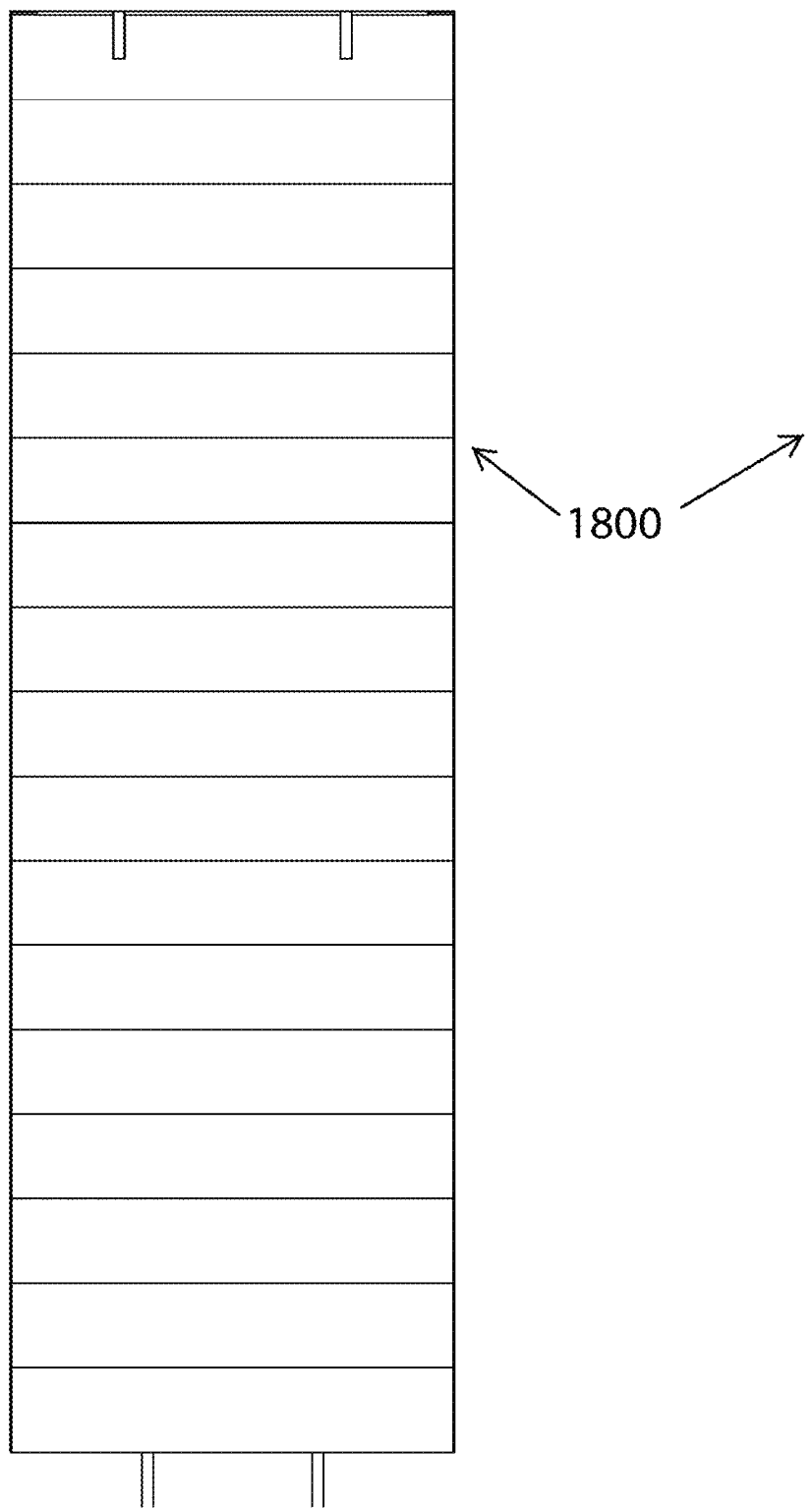
Figure 24:
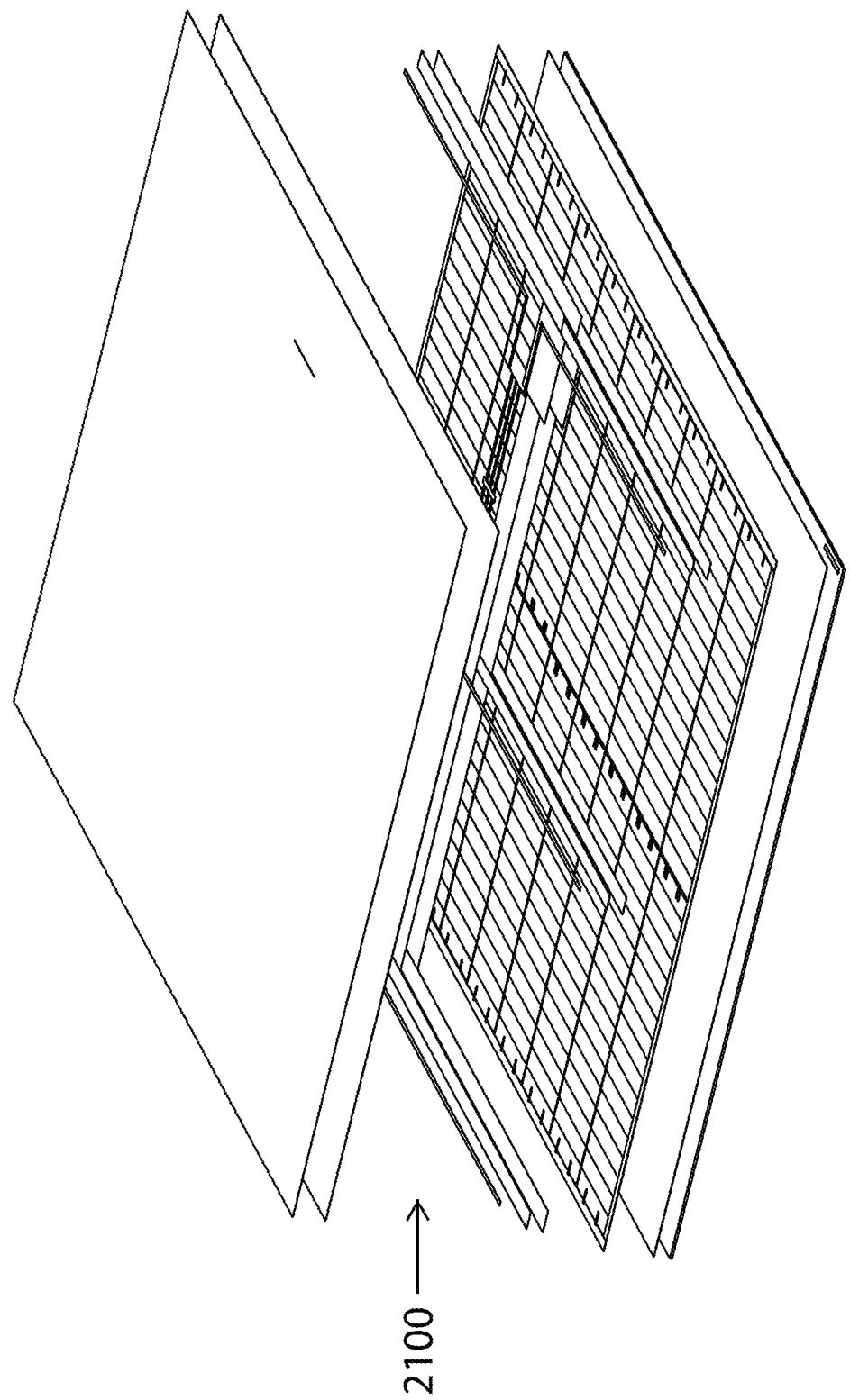
Figure 25:
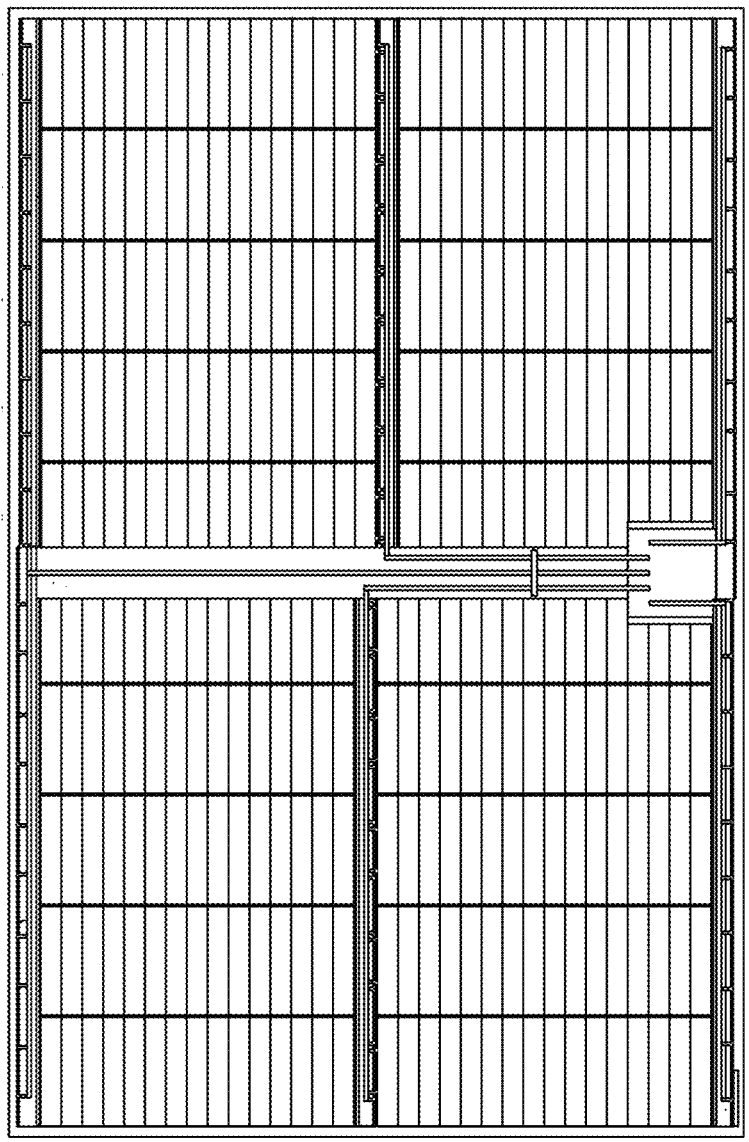

FIGS. 18-20 illustrate a photovoltaic string 1800 according to an example of the present invention.

FIGS. 21-25 illustrate a solar module 2100 according to an example of the present invention.

Figure 26:
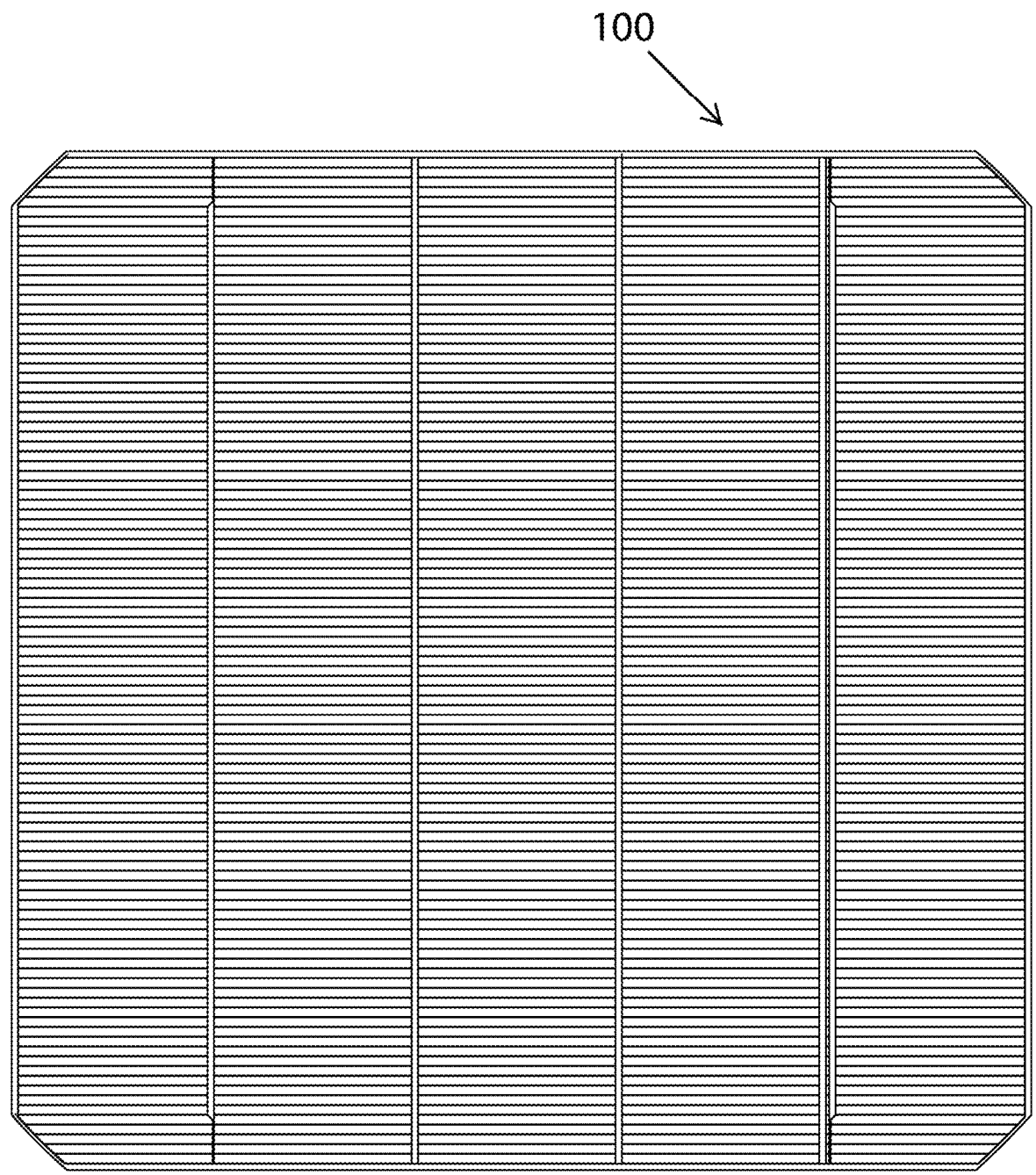
FIG. 26 is a front view of a solar cell in an example of the present invention.

FIG. 26 is a front view of a solar cell 100 in an example of the present invention.

Figure 27:
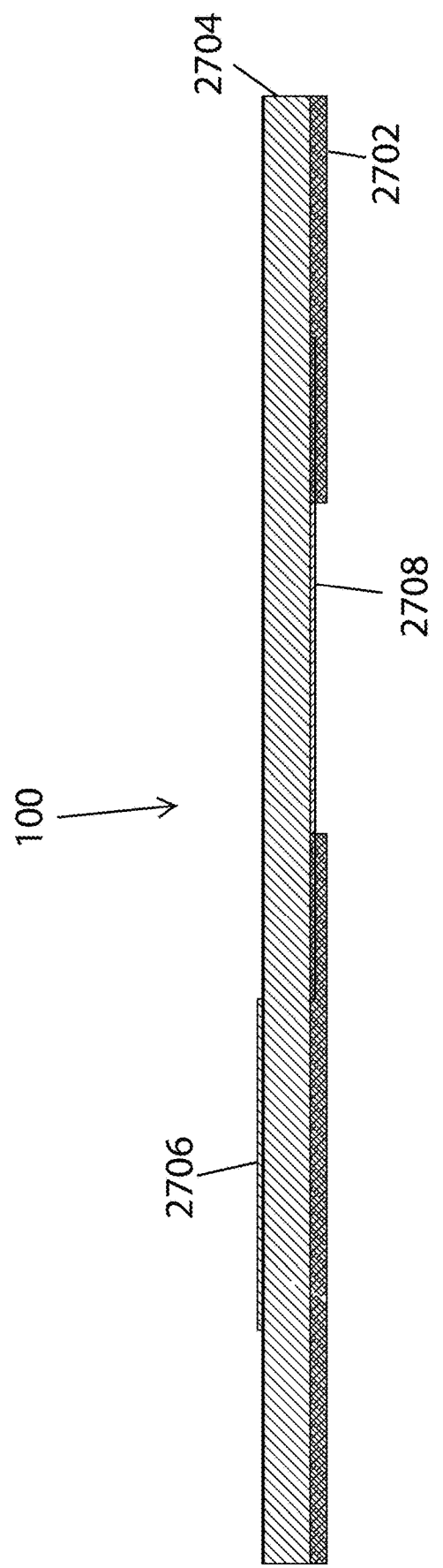
FIG. 27 is a side view of the solar cell, including bus bars, in an example of the present invention.

FIG. 27 is a side view of the solar cell 100, including bus bars, in an example of the present invention. The solar cell 100 includes a photovoltaic substrate 2704, a conductive backing material 2702, and metallized surfaces 2706 and 2708.

Figure 28:
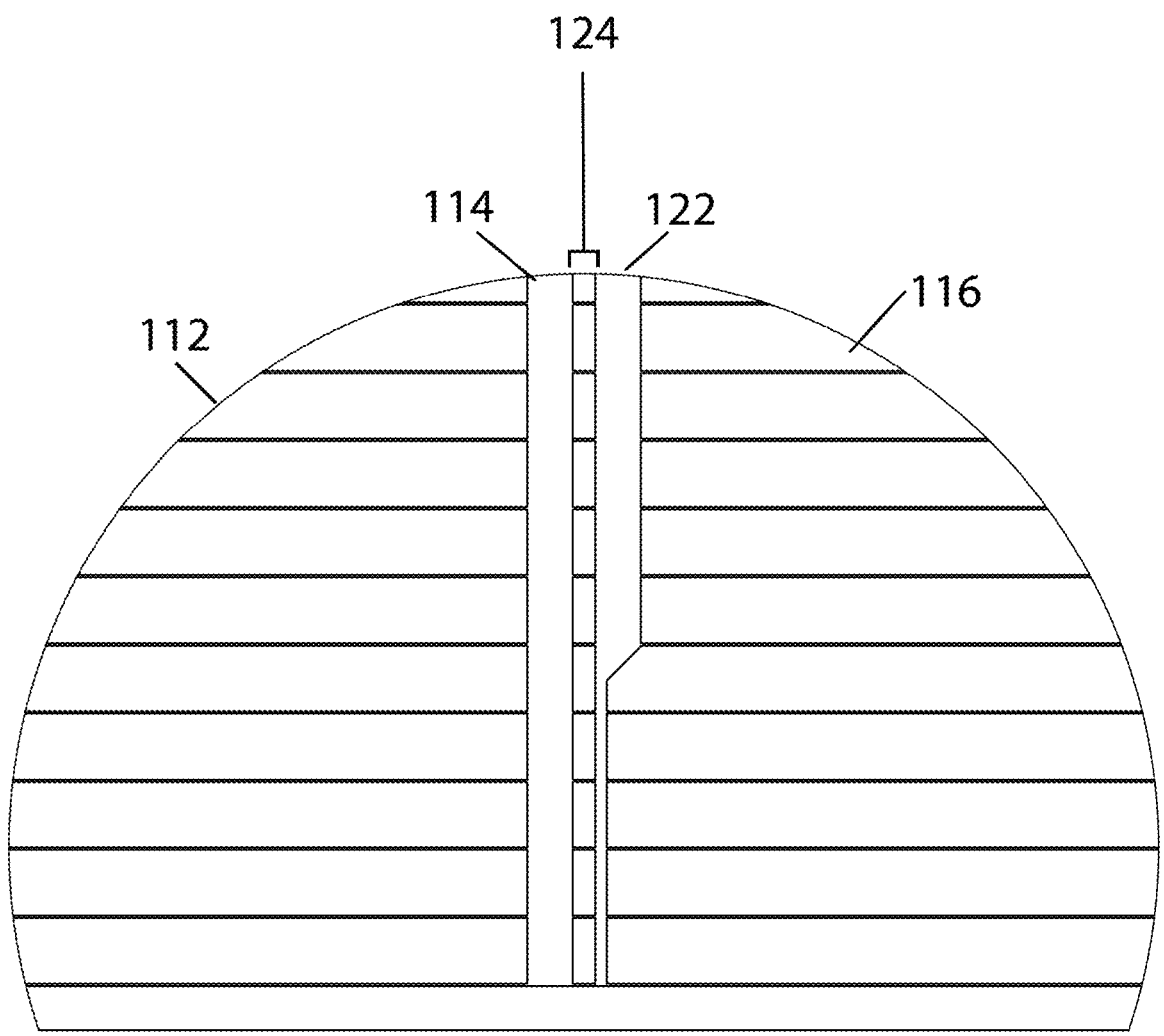
FIG. 28 is an expanded view of a bus bar in an example of the present invention.

FIG. 28 is an expanded view of a bus bar region of a solar cell 100 in an example of the present invention.

In an example, the present invention provides a method of manufacturing a solar module. The method includes providing a substrate member having a surface region. In an example, the substrate is a solar cell 100 as described in the present specification. The solar cell 100 is made of photovoltaic material, which has various features.

Features of FIG. 28 will be explained with respect to the numbering provided in FIG. 1. In an example, the surface region comprises a spatial region and a backside region, a first end strip 102 comprising a first edge region 104 and a first interior region 106 as provided on the spatial region. In an example, the first interior region 106 comprises a first bus bar 108, while the first edge region 104 on the spatial region has no bus bar, and a plurality of strips 112 as provided on the spatial region. In an example, each of the strips 112 has a bus bar 114 along an edge furthest away from the first bus bar 108, a second end strip 116 comprising a second edge region 118 and a second interior region 120, the second interior region 120 comprising a second bus bar 122 such that the second bus bar 122 and the bus bar 114 from one of the plurality of strips 112 forms a gap defining a scribe region 124, the second edge region 118 comprising no bus bar, the first end strip 102, the plurality of strips 112, and the second end strip 116 arranged in parallel to each other and occupying the spatial region such that the first end strip 102, the second end strip 116, and the plurality of strips 112 consists of a total number of five (5) strips 112, the backside region comprising the second end strip 116 comprising the second edge region 118, the second edge region 118 having a second backside bus bar 126 such that the second backside bus bar 126 and the second bus bar 122 are provided between photovoltaic material of the second end strip 116.

In an example, the method includes separating each of the plurality of strips 114. The method includes separating the first end strip 102, and separating the second end strip 116 by scribing via the scribe region 124 and removing the second end strip 116. Each of the separation processes can occur along a spatial direction of the substrate.

In an example, the method includes transferring the first end strip 102 in a first magazine, transferring each of the plurality of strips 114 into a second magazine or a plurality of magazines, and transferring the second end strip 116 into a second magazine. In an example, the method includes selecting each of the plurality of strips 114, and arranging the plurality of strips in a string configuration. The method then includes using the string in a solar module.

In an example, the substrate member comprises a silicon material, the backside region further comprising a first backside bus bar on the first end strip, and a plurality of bus bars respectively formed on the plurality of strips.

In an example, the substrate member has a dimension of 156 mm and within about two mm, but can be others.

In an example, each of the strips has a desired width to be assembled in the string configuration.

In an example, the plurality of strips are monolithically connected with each other. In an example, each of the plurality of strips has an aperture region. Further details of the present invention can be found throughout the present specification and more particularly below.

Figure 29:
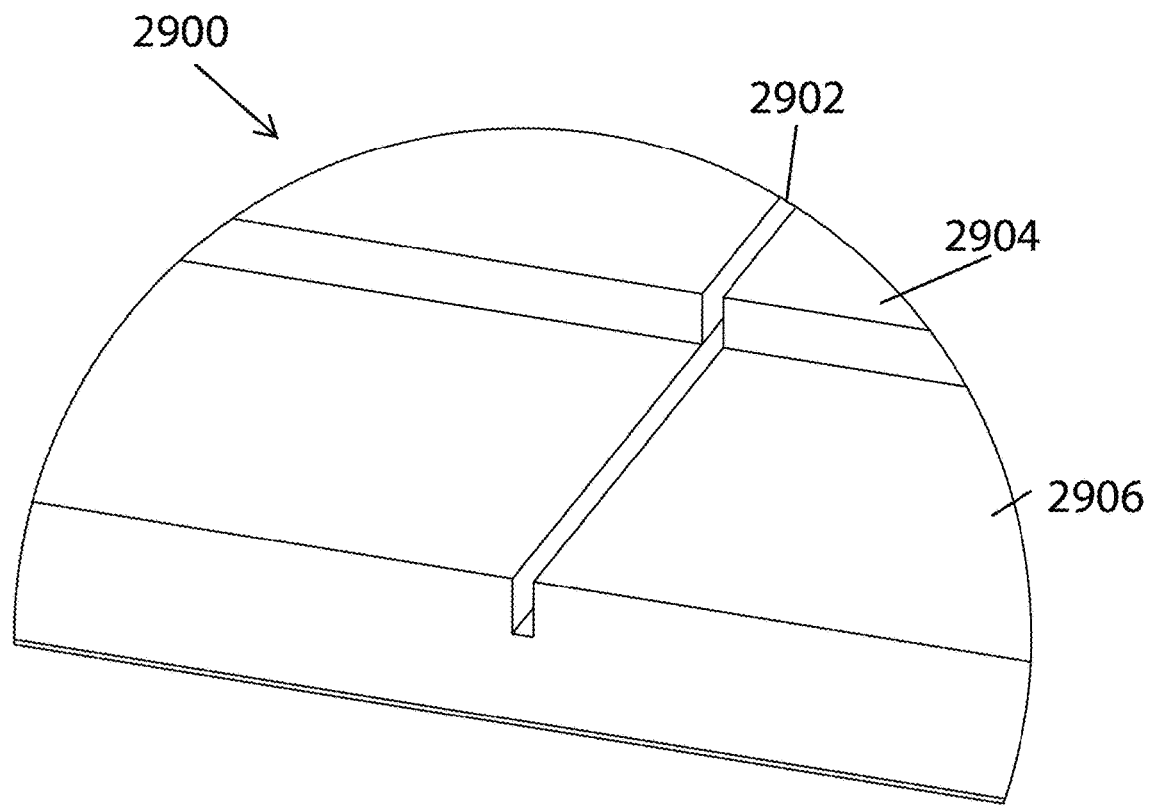
FIGS. 29-33 illustrate a solar cell under a cut and separation process according to an example of the present invention.
Figure 30:
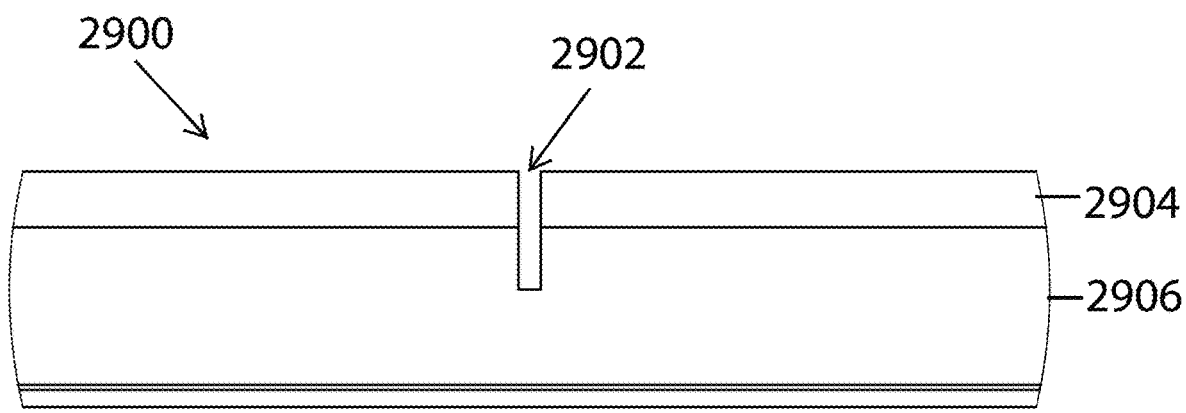

FIGS. 29-33 illustrate a solar cell 100 under a cut and separation process according to an example of the present invention. FIGS. 29 and 30 are isometric and front views that show a scribe region 2900 of a solar cell, including a kerf 2902 that is cut through a backing material 2904 and a photovoltaic material 2906.

Figure 31:
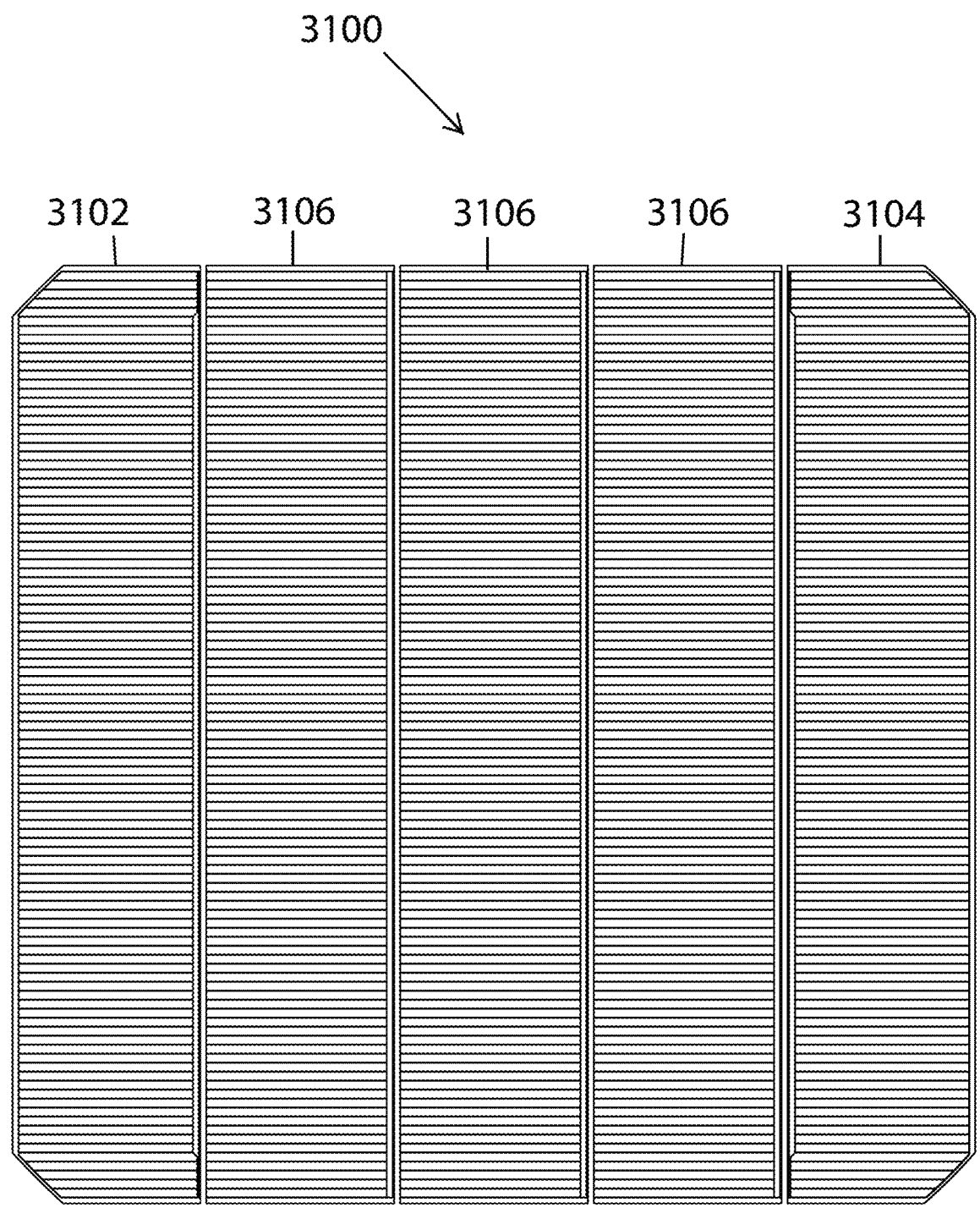
Figure 32:
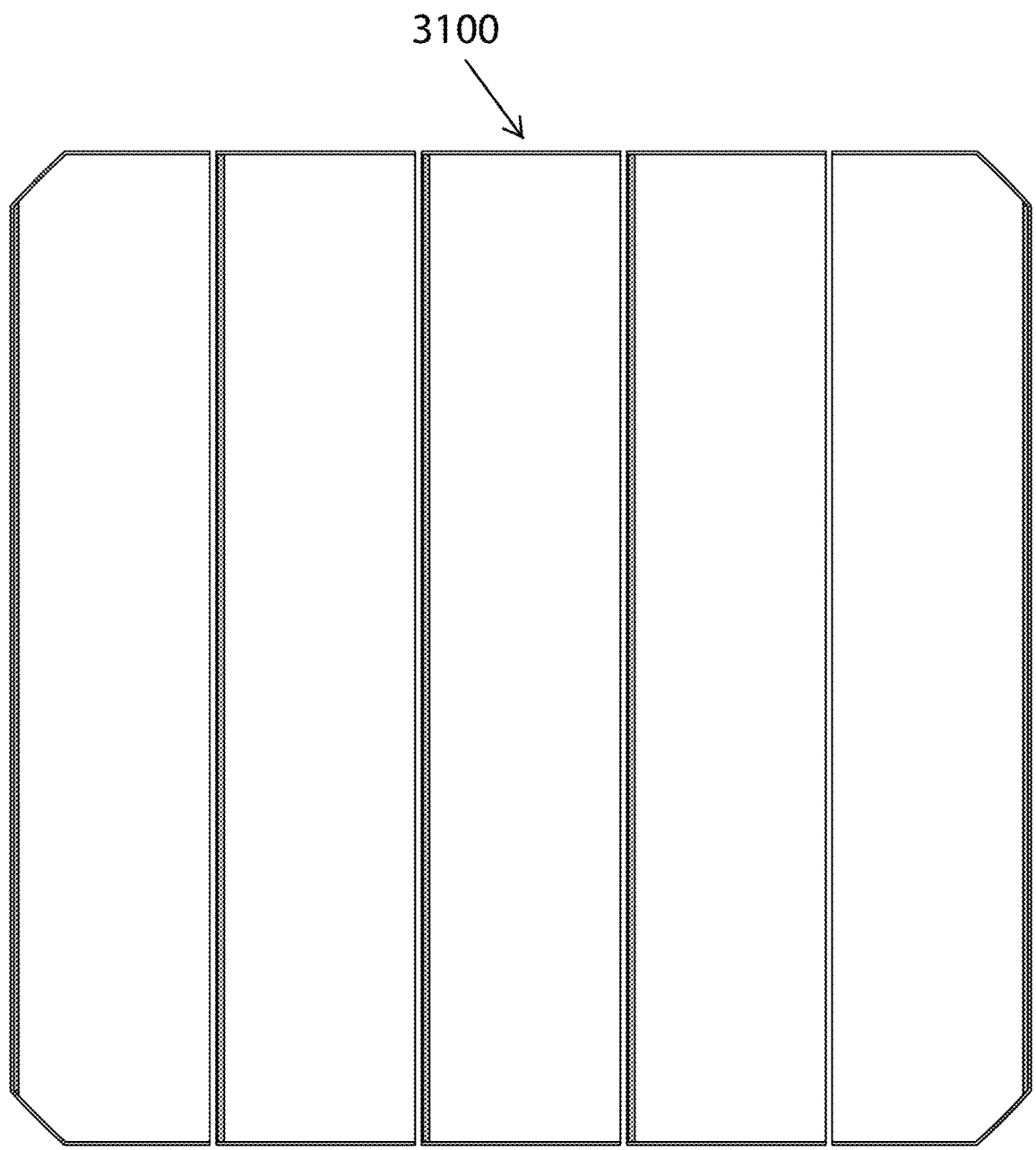
Figure 33:
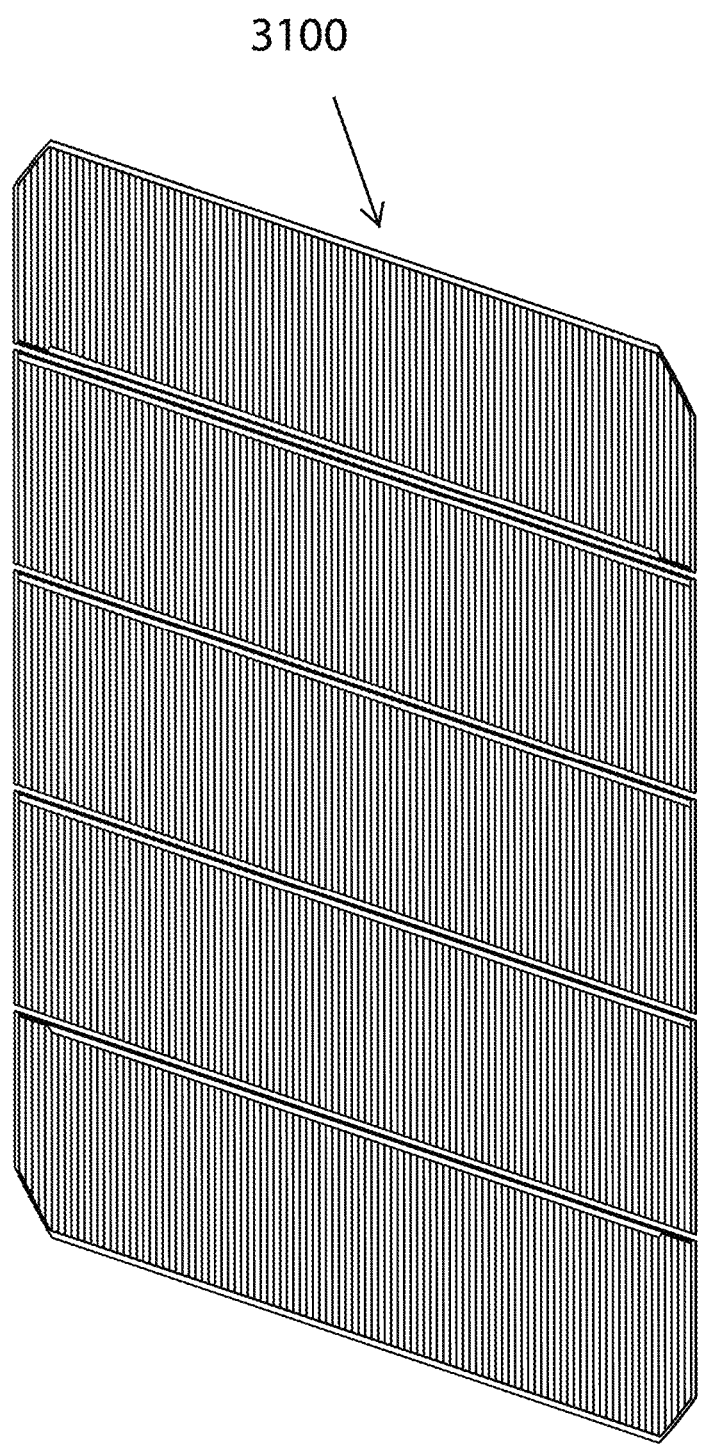

FIG. 31 shows a cell 3100 that has been subjected to a separation process. The separated cell 3100 includes a first edge strip 3102, a second edge strip 3104, and three strips 3106 from middle portions of the cell. FIG. 32 shows a backside view of the separated cell 3100, and FIG. 34 shows an isometric view of the separated cell 3100.

Figure 34:
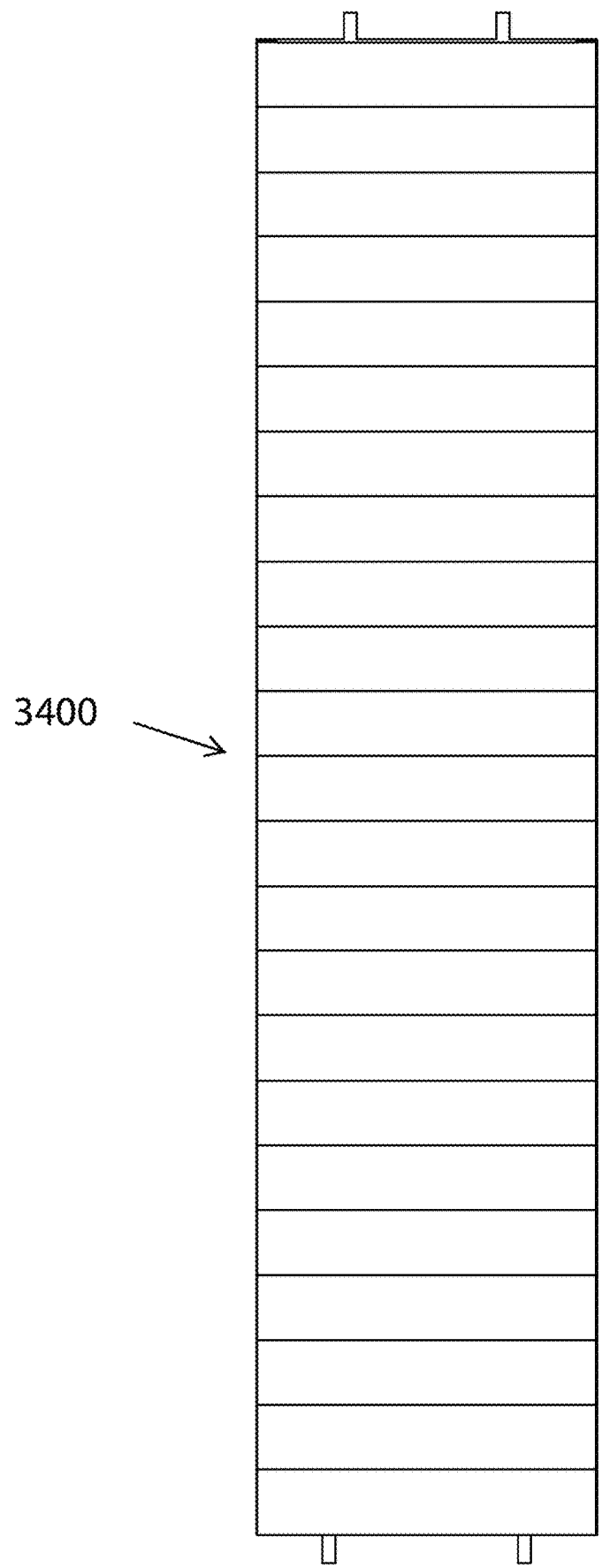
FIG. 34 is a top view of a photovoltaic string according to an example of the present invention.

FIG. 34 is a top view of a photovoltaic string 3400 according to an example of the present invention.

Figure 35:
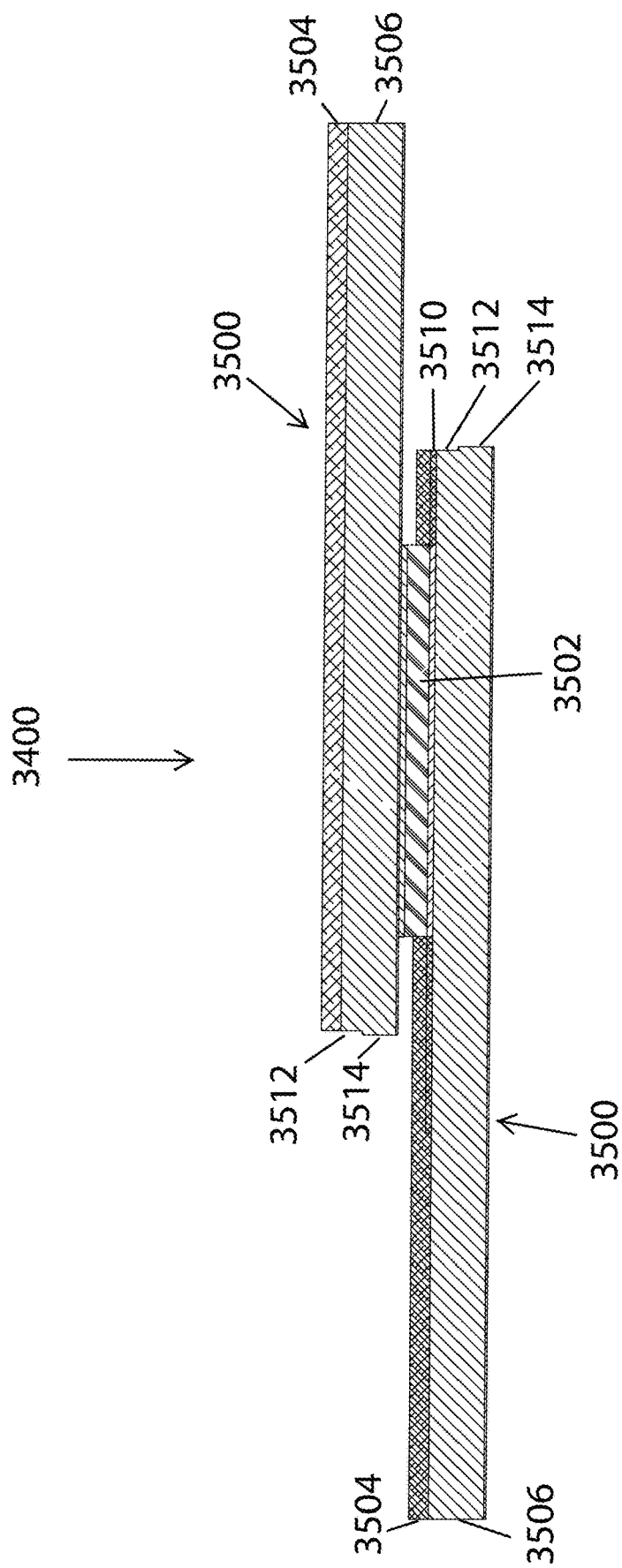
FIG. 35 is a side view of the photovoltaic string according to an example of the present invention.

FIG. 35 is a side view of the photovoltaic string 3400 according to an example of the present invention focused on a cell to cell overlap in the string. The photovoltaic string includes a plurality of strips 3500 that are bonded together by an ECA layer 3502. Each strip comprises a backing material 3504, which may be a thickness of aluminum, and a photovoltaic material 3506. The ECA 3502 is bonded between a conductive metallized layer 3510, which may be a bus bar, that is disposed between the backing material 3504 and the photovoltaic material 3506. The exposed ends of the strips 3500 show a kerf 3512 and a fracture plane 3514 from a scribing and singulation process.

Figure 36:
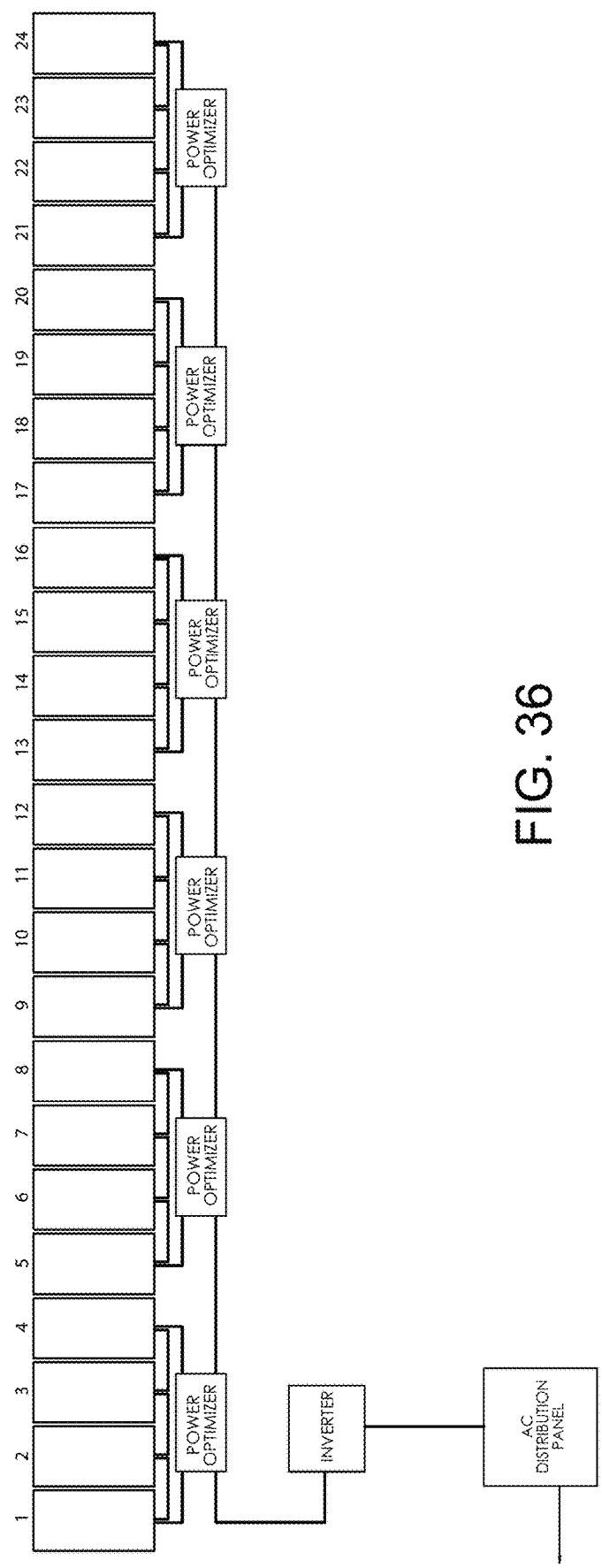
FIG. 36 is a simplified diagram of a simplified system diagram according to an example of the present invention.

FIG. 36 is a simplified diagram of a simplified system diagram according to an example of the present invention showing 24 strings coupled together in a single module.

In an example, the present method and system utilized a $\frac{1}{5}^{th}$ strip width versus $\frac{1}{3}^{rd}$, $\frac{1}{4}^{th}$ or $\frac{1}{6}^{th}$ of a cell strip width based upon some unexpected benefits and/or results, as shown in the table below.

|  | PV Width | | | | | Comment |
|---|---|---|---|---|---|---|
| Width | 78 | 52 | 39 | 31.2 | 26 | mm |
| Cell Current | 4.5 | 3 | 2.25 | 1.8 | 1.5 | Isc = 9A standard cell |
| Fingers | 80-200 | 80-150 | 80-120 | 80-100 | 80 | (Microns) Based on standard cell finger |
| Shading | 7.0% | 5.8% | 5.0% | 4.5% | 4% | Finger shading |
| Cell Utilization | 98.7% | 97.4% | 96.2% | 94.9% | 93.6% | 2 mm overlap |
| Placements | 2X | 3X | 4X | 5X | 6X | Over standard module |
| Fill Factor | 76% | 77% | 78% | 79% | 79% | |

In the table, width refers to the width of a strip after it has been cut from a cell. Current is the amount of current that a strip produces, which is directly proportional to the size of the strip. Fingers carry current across a strip, while shading is the area of the strip shadowed by the fingers. Cell utilization is the amount of area in a string in which strips do not overlap one another. The number of placements is how many strips are cut from a cell and placed in a string. Fill factor is the efficiency of the photovoltaic material present in a string compared to its maximum power producing potential.

In an example, modules are configured to have current and resistance characteristics that are similar to a conventional module (Voc, Vmp, Isc, Imp, Power). However, modules can be designed to have different characteristics for different applications. For example, modules created according to embodiments of this disclosure can be configured to have lower voltage and higher current for the solar tracking applications, and to have higher voltage and lower current for residential modules that interface with module power electronics.

In an example, the present method and design uses a 31.2 mm strip width, which optimizes module characteristics, as well as providing a current and voltage similar to standard modules. This allows embodiments to take advantage of standard inverters, electronics, and mechanical features. However, embodiments are not limited to these dimensions, and can be applied to other sized strips as well.

Figure 37:
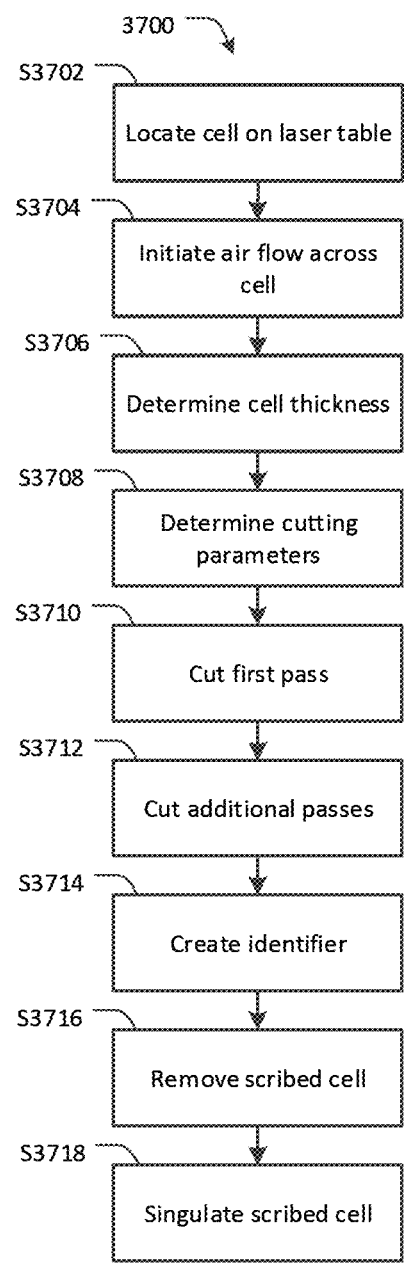
FIG. 37 illustrates a process for scribing and singulating a solar cell using laser energy according to an example of the present invention.
Figure 38:
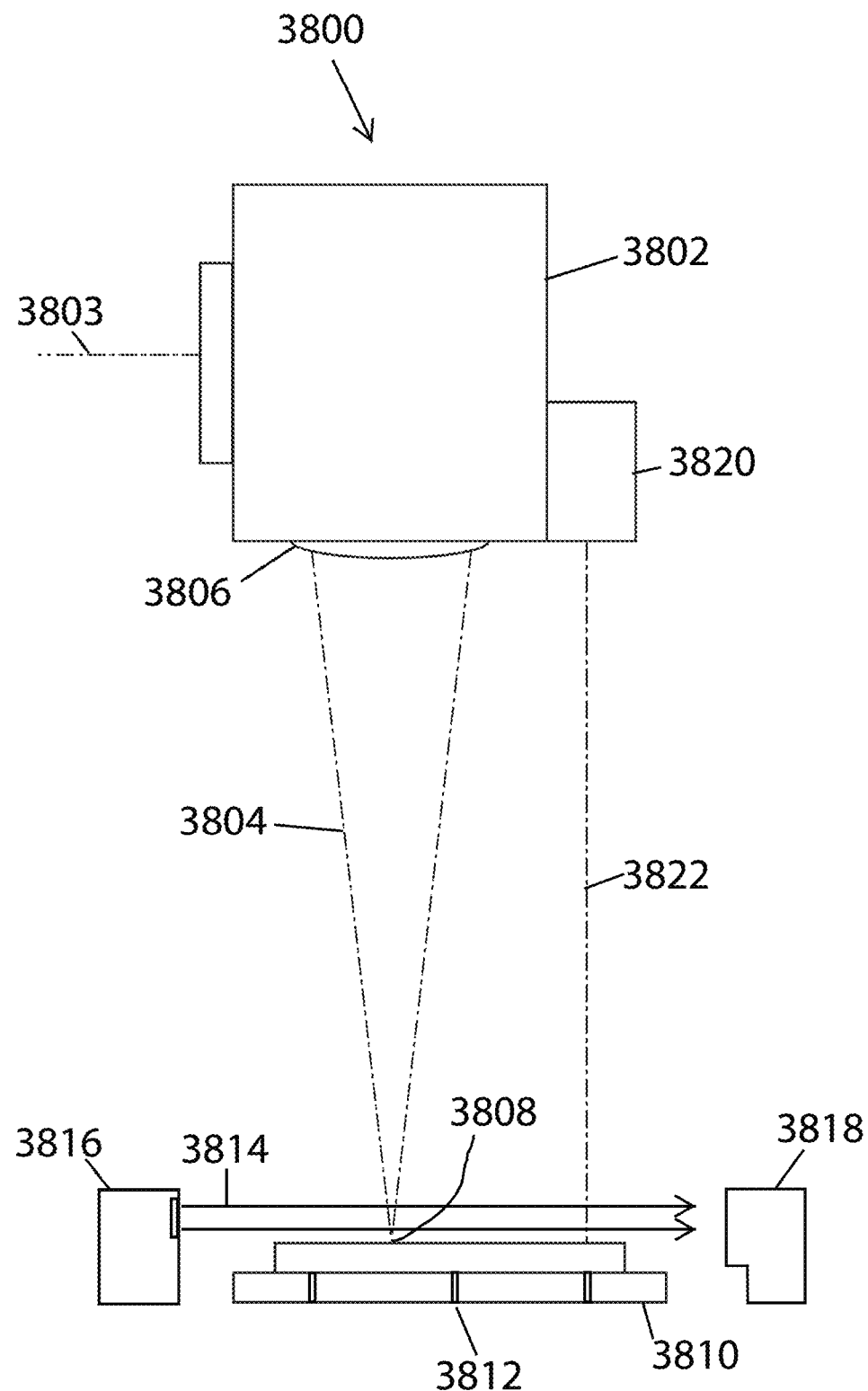
FIG. 38 illustrates a laser cutting system according to an example of the present invention.

FIG. 37 shows an embodiment of a process 3700 for scribing and singulating a solar cell using laser energy, which will be explained with respect to FIG. 38, which illustrates a laser cutting system 3800. The laser cutting system 3800 includes a scanner 3802 that projects a cutting laser beam 3804 that is focused by a lens 3806 to a laser spot 3808, which corresponds to a focal point of the lens 3806. In some embodiments, one or more elements of the laser scanner may be referred to as a galvanometer. In an embodiment, the laser spot is from 18 to 30 microns. In an example, the laser scanner 3802 receives laser energy 3803 from a beam expander (not shown), which is reflected by a plurality of mirrors from a laser source (not shown).

A cell 100 is located on a laser table 3810 at S3702. In one example, the laser table 3810 includes a vacuum chuck, or vacuum plate, which is defined by a flat upper surface with a plurality of holes 3812 through which a vacuum is applied. When the vacuum is applied, the negative pressure retains a face of the cell in place so that it is stationary when the exposed cell surface is scribed. In other embodiments, the laser table 3810 may be outfitted with one or more clamp mechanism that retains a solar cell 100, or retains a fixture to which a solar cell is affixed. In an example, the cell 100 is mounted so that its backside surface, which may be a conductive metal surface such as aluminum, is oriented upwards towards the laser. A distance between the upper surface of the solar cell 100 and the lens 3806 may be between about 250 and 350 mm.

A stream of air 3814 is initiated to flow across the surface of the cell 100 at S3704. The air stream is delivered by an air source 3816 and is received by a vacuum port 3818 located on the opposite side of the cell 100 from the air source 3816. In an embodiment, the air supplied through the air source 3816 is a laminar flow, as opposed to turbulent air, so that the air stream 3814 picks up dust particles generated by the laser cutting process and directs those dust particles to the vacuum port 3818, thereby effectively removing the dust particles from the chamber. Turbulent air flow carries the risk of redistributing dust particles within the laser system 3800, resulting in additional cleaning steps compared to a system that uses laminar flow. In an example, the air stream 3814 is a focused air stream that is directed to pass directly over a kerf as it is being cut.

The laser system 3800 may be outfitted with a distance sensor 3820. In an example, the distance sensor 3820 emits a laser beam 3822 and measures a reflection from that beam to determine a thickness of the solar cell 100. While solar cells 100 are manufactured to have a target thickness, process variation results in a thickness tolerance that can affect the depth of a laser kerf relative to the thickness of a cell. For example, solar cells that have a target thickness of 200 microns may have a tolerance of +20/−30 microns, so that the cells can range between 170 and 220 microns in thickness. Accordingly, the distance sensor determines the distance to the upper surface of cell 100, and using the distance from the distance sensor to the top of the laser table 3810, the sensor can determine a thickness value for the cell at S3706.

When the thickness of the cell 100 is known, cutting parameters may be determined at S3706. The cutting parameters may include, for example, a location of the spot 3808, or focal point of laser cutting beam 3804, in the vertical dimension, a horizontal travel velocity, an energy level of the laser beam 3804, a laser pulse frequency, a number of passes across the cell 100, etc. For example, a thicker cell 100 may be cut by using additional passes, a slower travel speed, and a different laser spot location, relative to a thinner cell. However, in other embodiments, predetermined parameters are entered into the laser system 3800.

The laser spot is passed across the exposed surface of a cell 100 at S3710 in a first pass. In various embodiments, the table may move relative to a stationary laser, or the laser may move relative to a stationary table.

Figure 39:
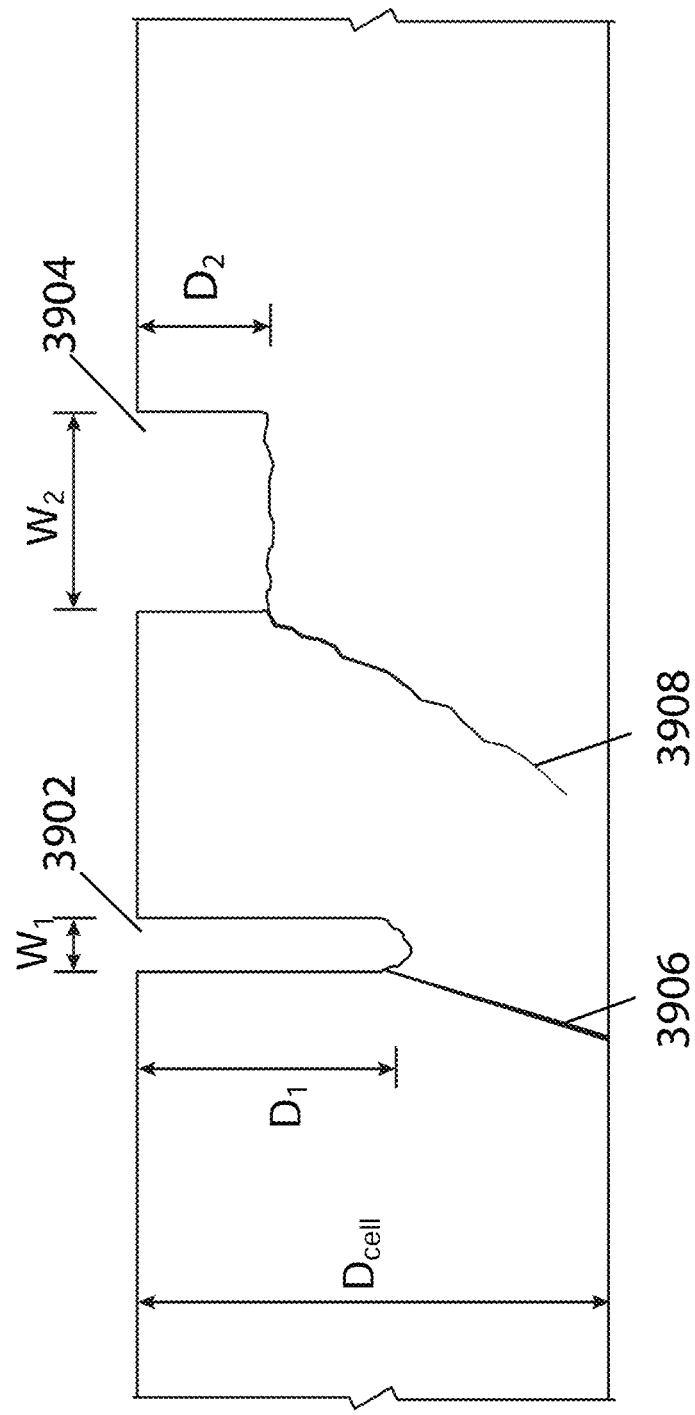
FIG. 39 illustrates kerfs in a solar cell according to an example of the present invention.

As the laser moves across the surface of a cell, it cuts out a kerf having a specific width or depth. For example, as seen in FIG. 39, a kerf such as first kerf 3902 or second kerf 3904 is cut from a cell 100. In an example, a kerf is cut to its final depth using a plurality of passes, such as from 2 to 40 passes, from 5 to 30, passes, or from 10 to 25 passes. Accordingly, after the first pass, additional passes are cut at S3712.

The laser cutting parameters may be determined at S3708 to ensure that a kerf is created with desirable characteristics. Substantial experimentation has determined that optimal kerf characteristics include a kerf depth D1 that is about half the thickness of a solar cell depth $D_{cell}$. In an example, the final depth D1 of a kerf is from 40% to 60% of the cell thickness $D_{cell}$. In an example, the kerf width is from 15% to 40% of the kerf depth, or from 7% to 20% of the cell thickness $D_{cell}$.

When kerf width and depth dimensions are wider than these conditions, such as in the case of second kerf 3904 having a width W2 that is substantially wider than the width W1 of first kerf 3902, a subsequent singulation process is affected. Here, a singulation process includes applying mechanical stress to a cell 100 near the location of a kerf to initiate a crack that separates the cell into two pieces. As seen in FIG. 39, when singulation is performed on a cell having characteristics of first kerf 3902, the resulting crack 3906 is relatively smooth and even, and is close to the location of the kerf in the width dimension. In contrast, when singulation is performed with a less desirable kerf such as kerf 3904, the crack 3908 created by the singulation process is rough and may travel farther from the kerf in the width dimension.

While the first kerf 3902 is representative of a kerf that results from lower laser power such as laser power from 20 to 40 watts, while the second kerf 3904 is representative of a kerf that would result from a higher laser power than the first kerf, such as a laser power from 40 to 60 watts. For example, the width of the second kerf 3904 is substantially larger than the width of the first kerf 3902. In addition, while the bottom of the second kerf 3904 is substantially flat, the bottom of first kerf 3902 is notched, or has a "V" shape.

The first kerf 3902 that results from laser cutting according to an embodiment of the present disclosure may have width and depth characteristics that can be expressed in both absolute and relative terms. For example, W1 may be from about 15 microns to 35 microns in absolute dimensions, or from 20 microns to 30 microns. In another example, W1 is from about 15% to 35% of the kerf depth D1. The depth D1 may be from 40% to 60% of the total depth $D_{cell}$ of the solar cell 100. In absolute terms, depth D1 may be from 65 microns to 132 microns. The precise kerf dimensions of a given embodiment may be determined with respect to dimensions of a given solar cell 100.

Figure 40:
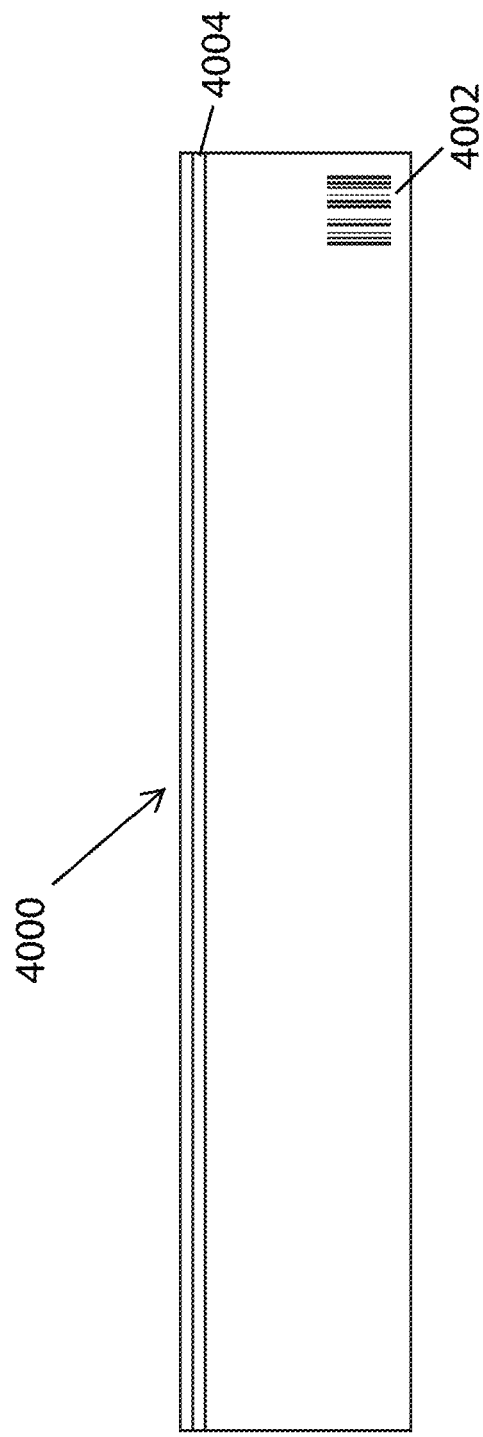
FIG. 40 a laser etched identifier according to an example of the present invention.

After all desired kerfs have been cut into a solar cell 100, one or more string element of the cell may be marked with the laser using an identifier that can be used to identify the string at S3714. FIG. 40 shows an embodiment of a strip 4000 that includes an identifier 4002. Also shown is a bus bar 4004. Information in the identifier may include, for example, a lot number, a date of manufacturing, an origin or destination, an order number, a serial number, a part number, etc. The identifier 4002 may be a one-dimensional bar code as shown in FIG. 40, or a two-dimensional code as known in industry.

In some embodiments, one or more letters or numbers may be applied in addition to, or as an alternative to, a one or two-dimensional identifier. The identifier 4002 may be cut into the exposed backside surface of one or more of the strips that are defined by the kerfs cut as described above while the solar cell is still retained by the vacuum of table 3810. The same laser apparatus may be used to create identifiers as is used to cut the kerfs, with substantially lower power.

The cell is removed from the laser system 3800 at S3714, and is subjected to a singulation process at 53716.

Smooth cracks have lower surface area than rough cracks. The increased surface area has a negative affect the performance of a cell. In addition, the rougher crack 3908 has a higher degree of variation as it propagates, so it has increased variation in the width dimension. The area of the crack that crosses semiconductor material in the width dimension directly affects the amount of energy that can be captured by a cell. In addition, a kerf with the characteristics of first kerf 3902 is less susceptible to chipping than second kerf 3904. For these reasons, the kerf 3902 is desirable compared to kerfs with other characteristics.

In an example, the wavelength of the laser cutting beam 3804 is from 200 to 600 nanometers. Lasers with higher wavelengths, such as red or infra-red wavelengths, tend to vaporize cell materials and create slag. While lower wavelength lasers such as UV wavelength lasers have high precision, and can create a relatively narrow kerf width, they are generally more expensive and prone to failure. Accordingly, in an example, the laser wavelength is in the green spectrum from 495 to 570 nanometers. In other examples, the laser wavelength is from 520 to 550 nanometers, from 525 to 540 nanometers, from 530 to 535 nanometers, and about 532 nanometers.

Intuition suggests that throughput can be increased by raising the power levels, since higher power lasers general remove more material at a faster rate. However, after considerable experimentation, it has been determined that optimum laser cutting conditions occur at relatively low power levels. One reason for this is that higher power levels tend to melt and vaporize solar cell materials. When solar cell materials are melted, more energy is absorbed by the solar cell material, and slag is created, resulting in a relatively rough kerf.

Figure 41:
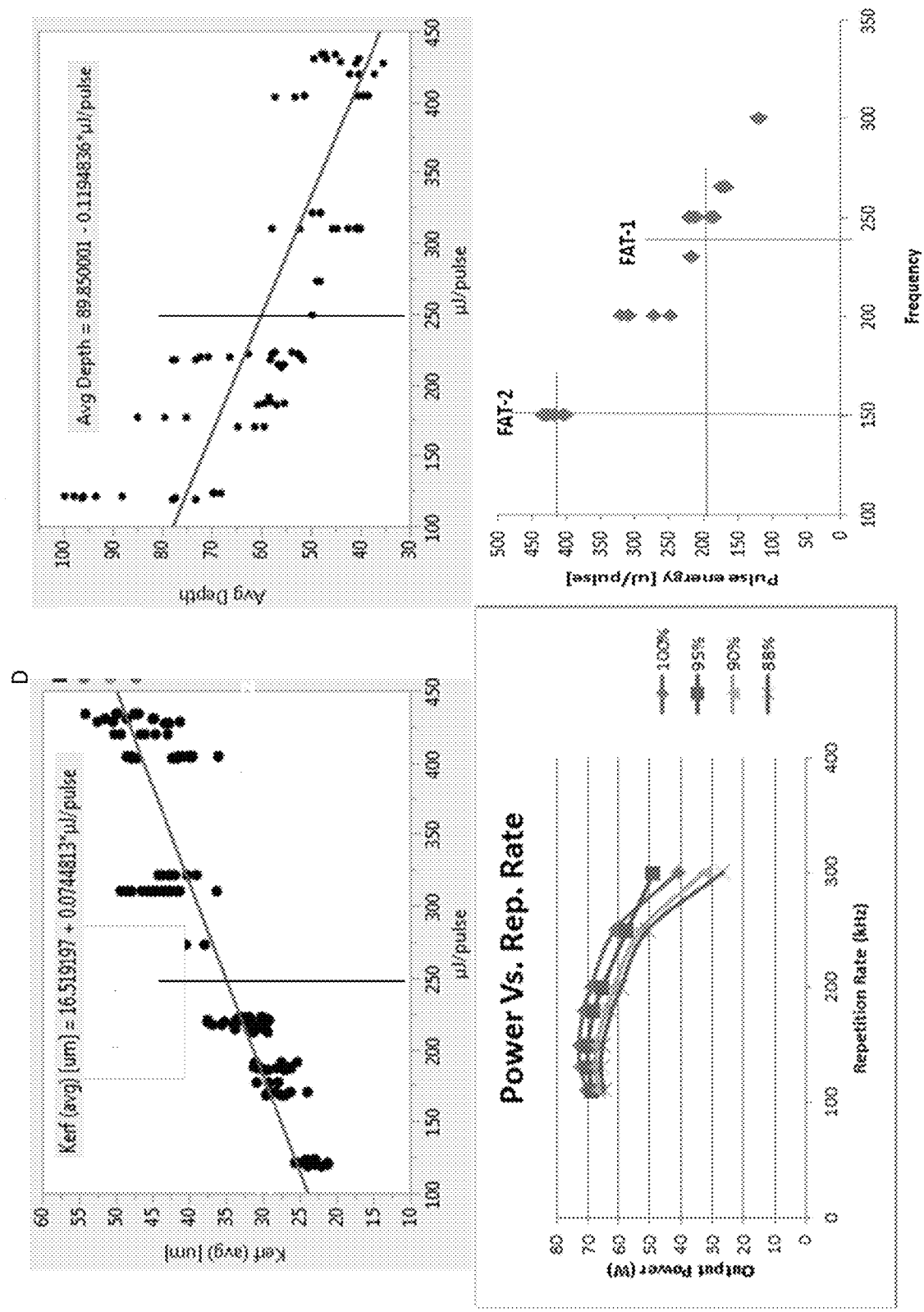
FIG. 41 illustrates experimental results of various laser power levels.

In contrast, as seen in the experimental data shown in FIG. 41, lower power levels effectively remove material at a faster rate. One reason for this is that lower power levels cause an ablation mechanism in which small particles, which can be described as dust particles, are effectively chipped away from the cell material by the laser. The experimental data suggests that ablation uses less energy to remove a volume of solar cell material than melting and vaporization, which occur at higher power levels. In addition, lower power levels tend to result in narrower kerf widths compared to higher power levels. Therefore, in an example, the laser energy when cutting a kerf in a solar cell 100 is from 20 to 35 watts.

Figure 42:
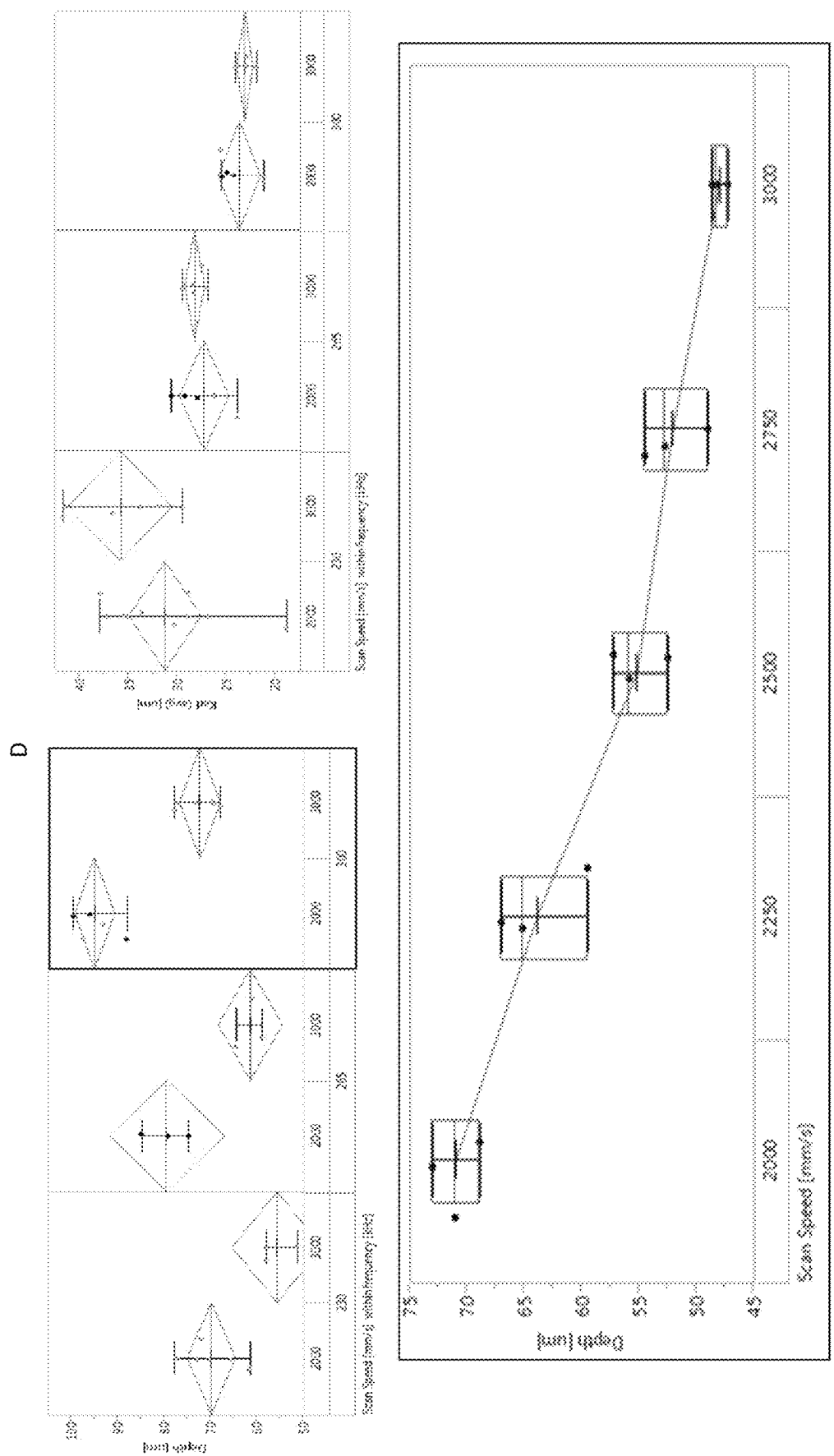
FIG. 42 illustrates experimental results for relationships between cell velocity and kerf depth.

The velocity of a cell 100 relative to a laser spot 3808 also influences the depth, width and roughness of a kerf. Higher velocities result in shallower cutting depths, which requires additional passes. In an example process, the velocity of the laser relative to the cell is from 4800 to 5000 mm/second, and from 2 to 40 passes are performed for each kerf location. In other examples, the number of passes is from 5 to 30, and from 10 to 25. Experimental data showing relationships between cell velocity and kerf depth at various frequencies is provided in FIG. 42.

In an embodiment, pulse energy may be from 100 to 500 microjoules per pulse, and pulse frequency may be from 100 to 400 kHz.

In an example, the present invention provides a method of separating a photovoltaic strip from a solar cell. The method includes providing a solar cell comprising either a single crystalline silicon material or a polycrystalline solar cell, the solar cell having a backside and a front side and a thickness, the backside having a metal material, and placing the front side of the solar cell on a platen such that the backside is facing a laser source. The method includes initiating a laser source to output a laser beam having a green wavelength and a spot size of 18 to 30 microns and subjecting a portion of the backside to the laser beam in a reduced power level ranging from about 20 Watts to about 35 Watts to cause an ablation to form a scribe region having a depth, width, and a length, the depth being about ½ of the thickness of the solar cell, the width being about ¼ of the depth, and the length being equivalent to a length of the solar cell. The method includes detecting a thickness of the solar cell and adjusting a speed of a movement of the laser beam based upon a thickness variation of the thickness of the solar cell. The method includes repeating the step of subjecting to create a plurality of scribe regions spatially disposed on the backside of the solar module.

In an example, the method includes moving the laser beam at a rate of 4800 to 5000 mm per second. In an example, the method includes subjecting occurs at least twice along the scribe region. In an example, the scribe region is shaped as a notch as viewed along an end of the scribe region. In an example, the detecting comprises applying a red laser to a surface solar cell to identify a height of the thickness of material. In an example, the adjusting comprises adjusting a number of passes for the scribe region to accommodate a thickness variation of the thickness of the solar cell. In an example, the detecting occurs using a laser having a different color than the laser beam from the laser source. In an example, the method of separating occurs within a time frame of 1 second to about 6 seconds to provide the plurality of scribe regions. In an example, the method further includes maintaining vacuum near a vicinity of the solar cell during the subjecting. In an example, the method includes subjecting a jet of fluid within a vicinity of the ablation to carry away particulate material, and capturing the particulate material using a vacuum. In an example, the method includes subjecting a fluid, using a laminar flow, within a vicinity of the ablation to carry away particulate material, and capturing the particulate material using a vacuum. In an example, the method includes maintaining the solar cell under a vacuum chuck to maintain the cell in a substantially flat position. In an example, the scribe region is a straight line+/−10 microns. In an example, the method includes scribing a unique identifier on each of the strips.

Exhibit 1, which is hereby incorporated by reference, is attached.

While the above is a complete description of specific embodiments of the invention, the above description should not be taken as limiting the scope of the invention as defined by the claims.

It is understood that the examples and embodiments described herein are for illustrative purposes only and that various modifications or changes in light thereof will be suggested to persons skilled in the art and are to be included within the spirit and purview of this application and scope of the appended claims.

The invention claimed is:

1. A method comprising:
providing a solar cell comprising either a single crystalline silicon material or a polycrystalline solar cell, the solar cell having a backside and a front side and a thickness, the backside having a metal material;
placing the front side of the solar cell on a platen such that the backside is facing a laser source;
initiating a laser source to output a laser beam;
subjecting a portion of the backside to the laser beam at least twice to cause an ablation to form a scribe region having a depth, width, and a length, the depth being from 40% to 60% of the thickness of the solar cell, and the length being equivalent to a length of the solar cell;
removing a vaporized material from a vicinity of the ablation; and
capturing the vaporized material using a vacuum.

2. The method of claim 1 wherein removing the vaporized material comprises subjecting a fluid, using a laminar flow, within the vicinity of the ablation.

3. The method of claim 1 wherein removing the vaporized material comprises delivering a jet of fluid to the vicinity of the ablation.

4. The method of claim 1 wherein the laser beam has a spot size of 18 to 30 microns.

5. The method of claim 4 wherein the laser beam has a wavelength from 200 to 600 nanometers.

6. The method of claim 1 wherein the laser beam has a wavelength in a green portion of the spectrum.

7. The method of claim 1 wherein the laser beam has a wavelength in an ultraviolet (UV) portion of the spectrum.

8. The method of claim 1 wherein the laser source comprises an infrared (IR) laser.

9. The method of claim 1 wherein the scribe region is shaped as a notch as viewed along an end of the scribe region.

10. The method of claim 1 wherein the scribe region is V-shaped.

11. The method of claim 1 wherein the scribe region is a straight line+/−10 microns.

12. The method of claim 1 wherein the thickness is from 170 to 220 microns.

13. The method of claim 1 wherein the length is 156 mm+/−2 mm.

14. The method of claim 1 wherein the depth is between about 65 and 132 microns.

15. The method of claim 1 wherein the width is from about 15% to 40% of the depth.

16. The method of claim 1 wherein the width is from about 7% to 20% of the thickness.

17. The method of claim 1 wherein subjecting the portion of the backside to the laser beam comprises applying the laser beam at a repetition rate of between about 100-300 kHz.

18. The method of claim 17 wherein the repetition rate is between about 100-200 kHz.

19. The method of claim 1 wherein subjecting the portion of the backside to the laser beam is performed at a height varying not more than +/−50 μm.

20. The method of claim 19 wherein the width varies by 5 μm or less along the length.

* * * * *